United States Patent [19]
Yastrow

[11] Patent Number: 5,410,490
[45] Date of Patent: Apr. 25, 1995

[54] ELECTROMIGRATION VERIFICATION METHOD AND APPARATUS

[75] Inventor: Philip G. Yastrow, Fort Collins, Colo.

[73] Assignee: Hewlett-Packard Company, Palo Alto, Calif.

[21] Appl. No.: 753,521

[22] Filed: Sep. 3, 1991

[51] Int. Cl.⁶ .............................. G06F 15/60
[52] U.S. Cl. .................................... 364/488
[58] Field of Search .................. 364/488, 489; 324/158 R; 307/201

[56] References Cited

U.S. PATENT DOCUMENTS

| | | | |
|---|---|---|---|
| T940,015 | 11/1975 | Ho et al. | 364/488 |
| 3,683,417 | 8/1972 | Gummel | 364/488 |
| 4,520,448 | 5/1985 | Tremintin | 364/488 |
| 5,040,134 | 8/1991 | Park | 307/201 |
| 5,049,811 | 9/1991 | Dreyer et al. | 324/158 R |

OTHER PUBLICATIONS

"PANAMA P-B: A Mask Verification System for Bipolar IC" by Yoshida et al., IEEE 18th Design Automation Conference, 1981, pp. 690–695.

"EXCL: A Circuit Extractor for IC Designs" by McCormick, IEEE 21st Design Automation Conference, 1984, pp. 616–623.

"Resistance Extraction in a Hierarchical IC Artwork Verification System" by Mori et al., IEEE 1985, pp. 196–198.

"Analytical Power/Timing Optimization Technique for Digital System" by A. E. Ruehli et al., IEEE 14th Design Automation Conference, 1977, pp. 142–146.

"LAS: Layout Pattern Analysis System with New Approach" by Y. Okamura et al., IEEE 1982, pp. 308–311.

"Introduction to MOS LSI Design" by J. Mavor et al., Chapter 8: Analogue MOS Circuit, Addison-Wesley Publishers Limited, 1983, pp. 179–207.

*Primary Examiner*—Vincent N. Trans

[57] ABSTRACT

A method of verifying the electromigration characteristics of a circuit is characterized by the following steps, to be performed for each net or node of the circuit: gathering data on the shapes of metal which compose the net; gathering data on the capacitance of the net; gathering data on the average frequency of the net; gathering data on the voltage swing of the net; computing the absolute value of the average current needed to charge and discharge the net; computing the minimum width of metal required for the met; and graphically indicating the location of any violations on artwork for the circuit.

19 Claims, 3 Drawing Sheets

ELECTROMIGRATION VERIFICATION METHOD AND APPARATUS

FIELD OF THE INVENTION

The present invention is generally related to the field of integrated circuits (ICs), and more particularly related to a method and apparatus for avoiding excessive electromigration in an IC device.

BACKGROUND OF THE INVENTION

The current density in an integrated circuit device becomes larger as the device becomes smaller. High current densities can cause electromigration, which in turn may result in device failure. Electromigration refers to the transport of mass in metals under the influence of current. It occurs by the transfer of momentum from electrons to positive metal ions. When a high current passes through thin metal conductors, e.g, in an IC, metal ions accumulate in some regions and voids form in other regions. The accumulation of metal ions may result in a short circuit to adjacent conductors, while the voids may result in an open circuit.

The electromigration resistance of some types of conductors, e.g., aluminum film conductors, may be increased by using several techniques, including alloying with copper, e.g., Al with 0.5% Cu, encapsulating the conductor in a dielectric, or incorporating oxygen during film deposition. Those and other techniques, however, are both expensive and unreliable in comparison to avoiding the source of the problem, i.e., preventing high current densities by specifying minimum conductor sizes in accordance with the expected operating conditions of the device. There are a variety of techniques in use in the electronics industry for specifying the minimum size of the conductors of an IC. However, none of the known techniques is easy to use; in fact, most require either tedious manual calculations or highly specialized software.

Accordingly, a primary goal of the present invention is to provide an automatic and reliable tool for verifying that a circuit layout complies with such electromigration specifications. A further goal of the present invention is to provide a tool that employs existing circuit analysis software, thus making it inexpensive and reliable. These goals are achieved by the present invention, a specific embodiment of which is described in this specification.

SUMMARY OF THE INVENTION

The present invention encompasses methods for making or designing an integrated circuit device. A first embodiment of the invention comprises the following steps: determining a capacitance of a net of a circuit; determining a frequency associated with the said net; determining a voltage swing associated with the net; computing a current on the basis of at least the said capacitance, frequency and voltage swing; computing a minimum allowable width for the net on the basis of at least the said current; and providing an indication of whether the net fails to meet the said minimum width requirement.

Another embodiment of the present invention further comprises the steps of determining the number of branches of the net and a static current, if any, associated with the net, and computing the said current as a function of at least the capacitance, frequency, voltage swing, number of branches and static current.

In another embodiment of the present invention the minimum width specification for a node of a three-layer device is determined in accordance with the following table:

| Bidirectional Current | Unidirectional Current |
|---|---|
| $w1 = (i/3.0 + 0.3)\ \mu m$ | $w1 = (i/1.0 + 0.3)\ \mu m$ |
| $w2 = (i/3.0 + 0.3)\ \mu m$ | $w2 = (i/1.0 + 0.3)\ \mu m$ |
| $w3 = (i/5.5 + 0.6)\ \mu m$ | $w3 = (i/2.0 + 0.6)\ \mu m$ | where i represents the current and w1, w2 and w3 represent the minimum widths for respective metal layers of the device.

In still another embodiment of the present invention the minimum width is determined in accordance with the rule:

$$w = (i/0.75 + 0.4)\mu m,$$

where w is the minimum width of a layer of the device.

Another embodiment of the present invention further comprises the step of determining whether the current is greater than the current allowed in a single contact and, if it is, providing an indication of such.

Yet another embodiment of the present invention further comprises the step of graphically indicating, on artwork representing the circuit, locations at which the width of the node should be increased.

The present invention also encompasses methods of verifying the electromigration characteristics of a circuit. Such methods are characterized by the following steps, to be executed for each net to be examined: determining data on the shapes of metal which compose the net; determining data on the capacitance of the net; determining data on the average frequency of the net; determining data on the voltage swing of the net; computing the absolute value of the average current needed to charge and discharge the net on the basis of the capacitance, average frequency and voltage swing; computing the minimum width of metal required for the net on the basis of the said current; and, if the net is in violation of the minimum width requirement, graphically indicating the location of the net on artwork for the circuit.

The present invention also encompasses apparatus for verifying the electromigration characteristics of an integrated circuit. An apparatus in accordance with the invention comprises means for determining a capacitance of a net of the circuit, means for determining a frequency associated with the net, means for determining a voltage swing associated with the net, means for computing a current on the basis of at least the capacitance, frequency and voltage swing, means for computing a minimum allowable width for the net on the basis of at least the current, and means for providing an indication of whether the net fails to meet the minimum width requirement.

Other features and advantages of the present invention are described below in connection with the detailed description of preferred embodiments.

DETAILED DESCRIPTION OF PREFERRED EMBODIMENTS

As discussed above, electromigration is a phenomenon related to the current density in a metallic conductor. The present inventor has devised a tool that breaks the electromigration problem into two parts:
1. Calculating the average current present at any node (or net) in the circuit.
2. Checking the metal and contact geometries to ensure each node is capable of carrying the given current (a contact is typically a plug of metal that joins separate layers).

The tool is invoked with the HPUX (a UNIX-like programming language) MAKE_ELECTRO command, which uses the —F option to specify the major frequency of the circuit under consideration. (Listings, or scripts, of the MAKE_ELECTRO program and subroutines invoked by MAKE_ELECTRO are provided in the appendix.) It is also possible to specify the operating frequency of individual nodes. The MAKE_ELECTRO script requires that a design rule check (DRC) and capacitance extract program be run first. The DRC and capacitance extract program of the present example is called TRANTOR, a program developed by engineers of the Hewlett-Packard Company (HP), the assignee of this application. TRANTOR is basically a program that manipulates and analyzes graphical data, therefore it may be used to analyze IC artwork data to compute the capacitance at the respective nodes of an IC. It should be noted, however, that the specific TRANTOR program is not necessary to practice the present invention. What is necessary is a program that is capable of generating capacitance data for the nodes of the device to be checked. Such programs are well known, thus it unnecessary to describe one in detail in this application. Thus, as used in this specification, the term TRANTOR refers to a generic program for extracting capacitance data for a circuit from a description of the physical layout of the circuit.

In the following discussion the term CMOS26 and CMOS34 refer to design rules or processes employed by HP. Briefly, CMOS26 is a high-speed, high-density CMOS process for building very large IC chips. It produces 1 $\mu$m FETs in circuits with up to three levels of aluminum interconnect. CMOS34 is a process for building poly-Si gate CMOS chips with one or two levels of aluminum metallization.

Figure 1:
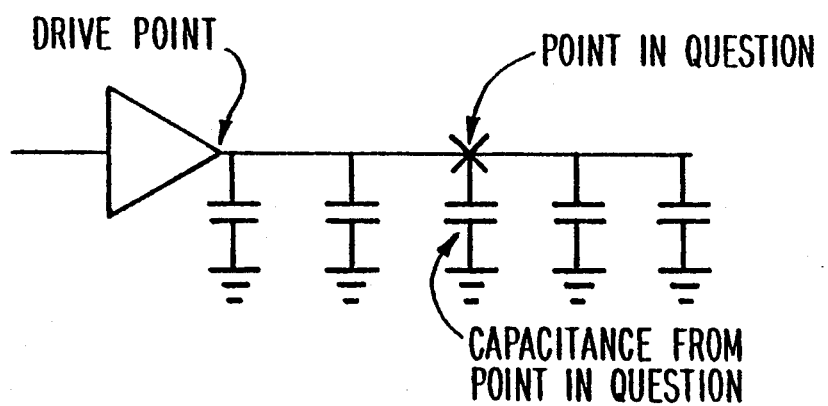
FIG. 1 is a schematic diagram illustrating the distribution of the capacitance of a node.

MAKE_ELECTRO calculates the average current at a node, commonly referred to as the cvf current; i.e., the current is proportional to the product of capacitance, voltage and frequency, as described below. MAKE_ELECTRO will also consider any user-specified static current. Points on the node that are farther away from the drive point (the point at which current enters the node) will have less current than points closer to the drive point. This is because the current at a point on the net is a function of the downstream capacitance, as shown in FIG. 1, which illustrates how capacitance is distributed along a conductor. The MAKE_ELECTRO tool uses the capacitance extracted and stored in a data file by TRANTOR. Due to the limitations of known capacitance extraction programs, MAKE_ELECTRO does not consider the incremental capacitance as a function of the distance from the drive point, but rather models the capacitance as one lumped value. In addition, it should be noted that TRANTOR does not consider the number of branches at a node.

Figure 2:
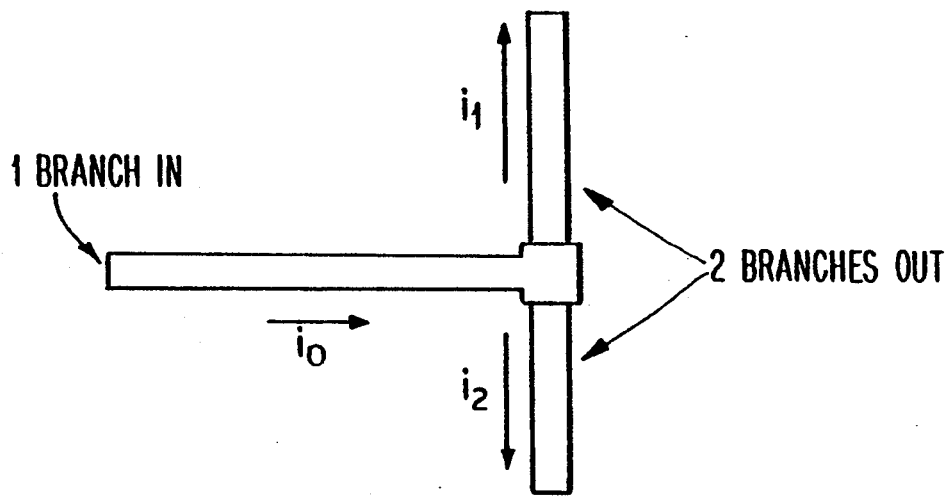
FIG. 2 is an illustration of a node with one incoming and two outgoing branches.

FIG. 2 depicts how current might be divided at a node that branches out, creating less current density on the node than if there were only a single branch. (In the figure, current $i_0$ divides into currents $i_1$ and $i_2$.) There is no information in the data generated by TRANTOR about how the capacitance is distributed throughout branches of a net. Thus, if an entire node were analyzed on the basis of the current at the drive point, the MAKE_ELECTRO program would tend to predict the "worst case" average current flowing at that node. However, it should be noted that MAKE_ELECTRO allows the user to manually specify the number of branches at each node (as described below), which mitigates the limitation of having the capacitance data computed as one lumped value.

The average current i at the drive point of any given node is computed by MAKE_ELECTRO in accordance with the following equation:

$$i = (((bi\_mult \times c \times vswing \times frequency) + static)/branches),$$

ps where vswing represents the voltage swing on the node, static represents the user-specified static current on the node and bi_mult is 1 if the current is unidirectional and 2 if the current is bidirectional.

There are three ways to specify the parameters used to calculate the average current associated with a node. From least to highest precedence they are:
1. The expected, or default, value.
2. The value supplied in a schematic diagram (or a data file representative of the schematic diagram).
3. The value supplied in the OVERRIDE_DEFAULTS file.

Figure 3:
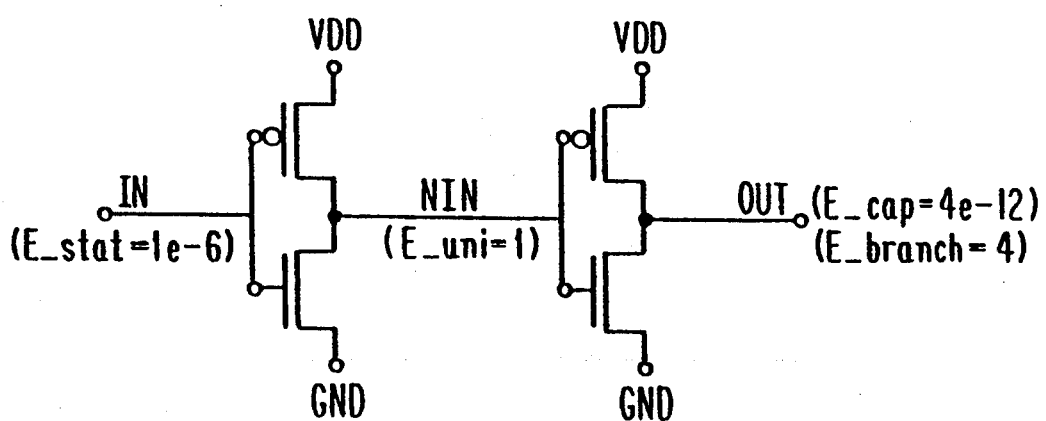
FIG. 3 is a schematic diagram of an exemplary IC device.

Consider as an example the capacitance of a single node. The default value is the amount TRANTOR provides. To add extra capacitance to the node, the property E_cap may be placed in the schematic diagram along with the amount to be added, as shown in FIG. 3, wherein a capacitance of 4e-12 (4 picofarads) is added to the node labelled OUT. In addition, the parameter E_stat=1e-6 indicates a static current on the node IN, E_uni=1 indicates a unidirectional current of 1 milliamp on the node NIN, and E_branch=4 indicates that the node OUT is to be analyzed as having four branches. Another way to modify the capacitance is to edit the OVERRIDE_DEFAULTS file. The OVERRIDE_DEFAULTS file is a data file that is created by the user to override the default values, e.g., the values created by the capacitance extraction program.

The electromigration specifications for CMOS26 at 110° C. yield the following equations for the minimum widths of metal1, metal2 and metal3, respectively, where metal1, metal2 and metal3 designate respective metal layers of a circuit (these equations are of course only examples of how one could specify minimum line widths; the specific equations appropriate in a particular instance will depend upon the design rules being employed):

| Bidirectional Current | Unidirectional Current |
|---|---|
| w1 = (i/3.0 + 0.3) μm | w1 = (i/1.0 + 0.3) μm |
| w2 = (i/3.0 + 0.3) μm | w2 = (i/1.0 + 0.3) μm |
| w3 = (i/5.5 + 0.6) μm | w3 = (i/2.0 + 0.6) μm |

The rule for both metal1 and metal2 in CMOS34 is: w=(i/0.75+0.4)μm. As mentioned above, CMOS26 and CMOS34 designate different respective manufacturing processes and sets of design rules employed by HP. Insofar as this specification is concerned, the significance of those processes is that a CMOS26 device has up to three layers of conductors and a CMOS34 device has up to two layers of conductors.

The layouts of each net are examined by MAKE_ELECTRO (using TRANTOR) for locations that are less than the minimum calculated width. The metal surrounding all contacts is also checked to ensure it is sufficient to carry the expected current.

The MAKE_ELECTRO tool also determines whether the current in a net is greater than that allowed to flow through a single contact of any type. If this is the case, all contacts of that type on the net are flagged, indicating that multiple contacts are necessary to carry the current.

All of the errors are output into a database and may be examined with a conventional graphical editor (such editors are well known). The electromigration errors are then superimposed on top of the artwork for the circuit, thereby making it easy for the design engineer to see the locations where metal must be added to comply with the minimum width specification.

Figure 4A:
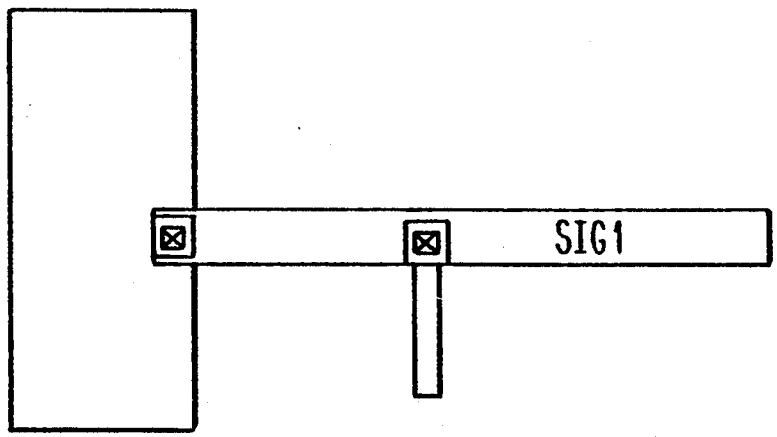
FIGS. 4(a) and 4(b) illustrate how electromigration specification violations are indicated on the artwork of an IC in accordance with the present invention.
Figure 4B:
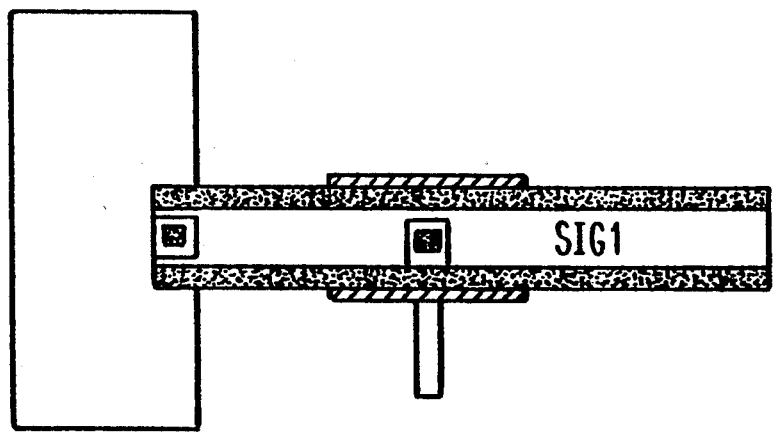

FIG. 4(a) shows the conductors and contacts (the boxes containing the symbol "X") associated with the net SIG1, which have been defined to have a capacitance of 10 pF in the OVERRIDE_DEFAULTS file. FIG. 4(b) illustrates the resulting electromigration errors when checked at a frequency of 100 MHz. There are two types of errors shown in FIG. 4(b). The gray regions represent errors that relate to metal width, exclusive of contacts, and the crosshatched regions represent errors associated with contacts. As indicated by the fact that the contacts themselves are gray, there is more current on the net than can be carried in a single contact.

A log file (a file where error messages and other kinds of data are written while the program is running) created by MAKE_ELECTRO and called "electro_$ICPROCESS/electro_log" (where "$" indicates a variable name) contains the following lines, which show the parameters used in checking SIG1 and the number and types of resulting errors:

```
SIG1 C=1.00078e-11 I=11.00858 w1=3.96952666666667
     w2=3.9695266666667 w3=2.60156
branches=1 static=0 f=100000000.0 v=5.5 BIDIR
metal1: 2
metal1 contact: 3
metal2 contact: 1
```

In the above listing, w1, w2 and w3 are the respective widths needed for the metal1, metal2 and metal3 specifications. Because I=11.00858 milliamps and the current is bidirectional, the limit of 3 milliamps per contact has been violated in this example and at least four contacts would be needed to carry the full current. (The limit of 3 milliamps per contact is specified in the CMOS26 design rules.) Further, the listing indicates that at two locations the width of the metal1 layer must be increased and that the maximum current specification for three metal1 contacts and one metal2 contact has been exceeded.

In addition, the average current may be divided by four by changing the number of branches, which in the present example would cause the cell to pass. It is important to note, however, that changing the branch value can mask errors, so the errors present with branches equal to 1 should always be considered before increasing the number of branches.

Figure 5:
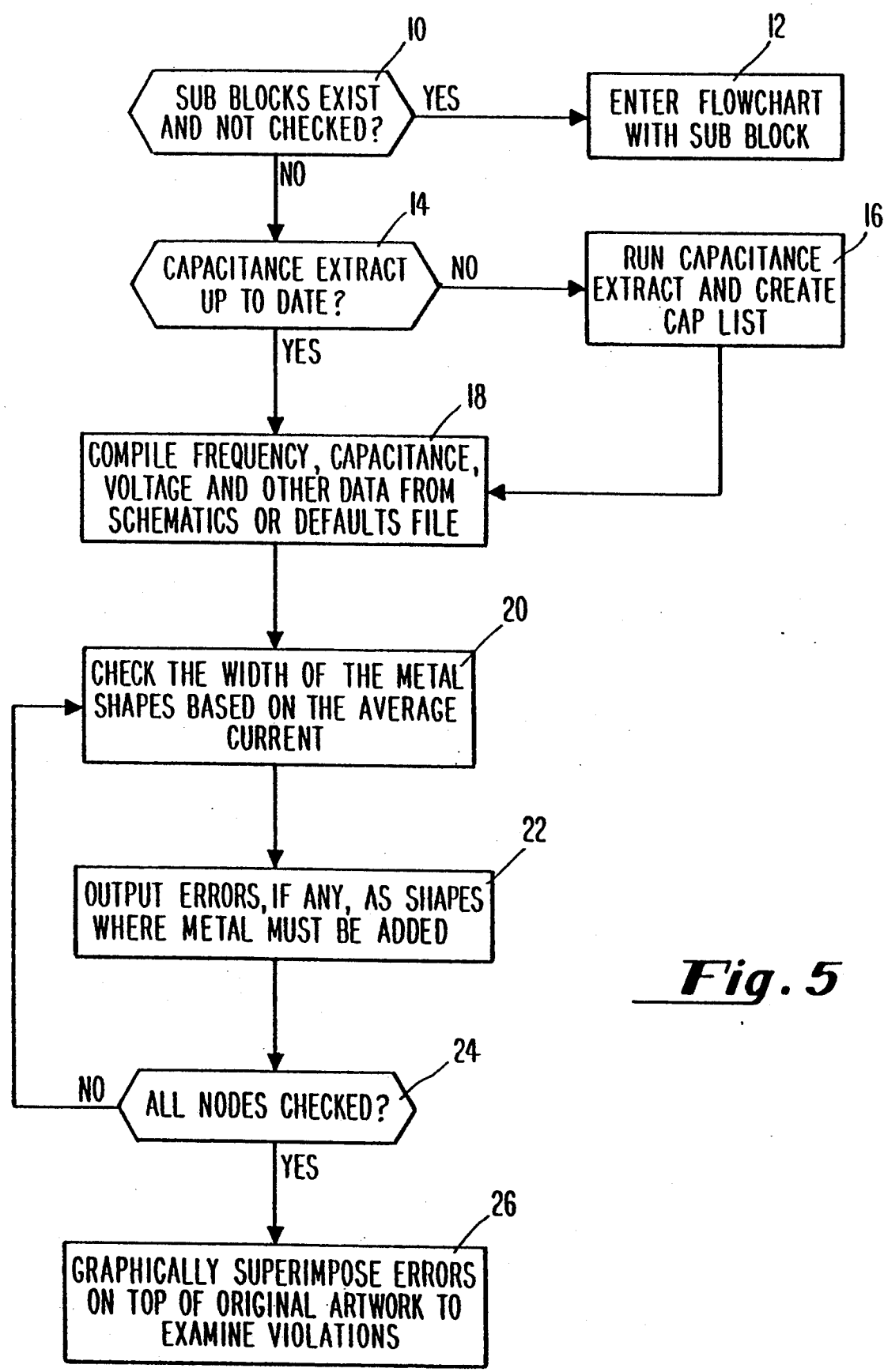
FIG. 5 is a flowchart of an electromigration verification program in accordance with the present invention.

FIG. 5 is a flowchart of an electromigration verification algorithm in accordance with the present invention. The flowchart is described next, and after that description is a brief description of the source code in the appendix.

At block 10 the program determines whether any sub-block (i.e., a lower level block in a hierarchical design) exists that has not been checked. If any such sub-block exists the program branches to block 12 and checks that sub-block before checking the remaining circuit.

At block 14 the program determines whether the capacitance data for the circuit at hand is up-to-date. This is carried out by examining the respective date codes of the capacitance data file and the circuit model data file.

At block 16 the capacitance extract program is run if the capacitance data is not current.

At block 18 the frequency, capacitance, voltage, etc., data from the schematic or OVERRIDE_DEFAULTS file is compiled, i.e., read into memory.

At block 20 the minimum widths for the respective layers of a particular node are determined and then compared to the actual respective widths as indicated by the circuit's artwork.

At block 22 any errors are output as shapes where metal must be added.

At block 24 the program determines whether all nodes have been checked and, if not, loops to block 20 to check the next node in the list.

At block 26 all error shapes are superimposed on the artwork so that the design engineer can easily determine where conductor widths must be increased.

Turning now to the source code in the appendix, the MAKE_ELECTRO script controls processing of all user options and variables. It then invokes CBMAKE (a UNIX MAKE equivalent for hierarchical chip design) with the target electro_$ICPROCESS/electro_passed (see lines 216, 294 and 197 of the MAKE_ELECTRO script). This starts a chain of dependency checking to ensure the correct actions are taken.

The basic CBMAKE control file is ART.CBM (the source code is in the appendix), which includes ELECTRO.CBM on line 1369. The definition of the ELECTRO_PASSED target is on line 82 of the ELECTRO.CBM script. This definition states that once a TRANTOR.DB file (i.e., a TRANTOR data base) exists for the block being examined, it is done. The rule for a TRANTOR.DB to be valid is on line 20 of the ELECTRO.CBM script. That rule states that the target ELECTRO_READY must be valid. Line 10 describes the ELECTRO_READY target in the chain of dependencies. There are three dependencies for that target (which carries out block 10 of FIG. 5). First, line 11 states that all sub-blocks must have been verified, i.e., that their ELECTRO_PASSED target is valid; any invalid sub-block will be verified starting at line 82. In addition, the capacitance extract target (CAP_PASSED) must be up-to-date. If CAP_PASSED is not current, it is expanded in accordance with the rules starting on line 1308 of ART.CBM. These rules are not described in detail in this specification since capacitance extraction methods are well known. The final dependency of ELECTRO_READY is in the MIGRATE.IN file (line 12, ELECTRO.CBM), which results from the actions indicated in block 18 of FIG. 5.

The rules for building MIGRATE.IN start on line 30 of ELECTRO.CBM. First, the function SAME_AS_LAST_FREQUENCY (defined on line 300, ART.CBM) will cause MIGRATE.IN to be rebuilt if the frequency has changed, even if the circuit itself did not change. The other dependencies for this target are the schematic properties target (SCH_PROPS), which is checked to ensure that all user specified properties in the schematic have been compiled, an override defaults file template (called DEFAULTS in the source code) for the user, which is created, and the capacitance extract data, which is compiled into a user readable file called CAPSUM.MAX.

The SCH_PROPS file is created by the rules described on line 70 of ELECTRO.CBM. The SCH_PROPS file contains a sequence of TRANTOR commands executed in the TRANTOR script GET_SCH_PROPS, which lists all schematic properties and extracts those properties beginning with "E_", which by convention is the prefix for all schematic electromigration properties. The DEFAULTS file, which is a place for the user to define properties textually, is initially created by the ELECTRO_DEFAULTS program as a template so the user will not have to memorize the proper syntax. (It should be noted that the DEFAULTS file of the source code is equivalent to the OVERRIDE_DEFAULTS file discussed above.)

Once the dependencies for MIGRATE.IN are valid, the file is created. This is done via BuildElectroScript, which uses the UNIX AWK program to compile all of the data from CAPSUM.MAX, DEFAULTS and SCH_PROPS into a sequence of commands that may be used to check the width of all nodes in the circuit.

At this point the ELECTRO_READY target has been validated and the actual electromigration check begins with the actions needed to create the TRANTOR data base (TRANTOR.DB). These actions start on line 22 of ELECTRO.CBM. The control file for these actions is MIGRATE.BATCH, which is invoked on line 26. This script initializes some variables and executes the script MIGRATE.IN.

MIGRATE.IN contains a series of calls to the program doWidth. The loop encompassing blocks 20 through 24 of FIG. 5 is carried out by MIGRATE.IN calling doWidth for each node in the circuit, using its precomputed values. doWidth checks the geometries of the metal shapes and also outputs errors onto "violation layers" as needed. It is these violations that are graphically superimposed on the actual artwork to show where metal must be added because of electromigration violations.

The foregoing analysis is generally valid for non-power supply nodes. This is because the current flowing in a power supply line is not a function of only the capacitance on that line; it is a function of the total current consumed and discharged in the block it supplies. An extreme worst case approach is to add all the capacitances inside of the block and compute the total possible current capacity of the power supply based on the maximum frequency of the entire block. A better approach is to calculate the average power expected to be dissipated in the block under certain predefined conditions. Then the power supplies may be sized according to the electromigration specifications and the average current contributing to the iv or $cv^2f$ power dissipation.

The system described above is a specific example of one embodiment of the present invention. Many modifications of that embodiment will be within the true scope of the invention, as set forth in the claims. For example, the system described above may be modified in the following ways:

(1) The voltage and capacitance on a node may be computed as a function of the distance from the drive point. Unless this is done, every point on the net is checked for the width required at the drive point.

(2) The number of contacts may be checked in determining if there is a problem. The method described above flags all contacts on a node if the average current calculated is greater than the amount a single contact is capable of carrying. The number of contacts needed may be computed by determining from the log file the amount of current a single contact is capable of carrying and dividing the average current by that number.

(3) The system described could be modified to check for errors at 85° C. instead of or in addition to 110° C.

```
1    #! /bin/sh
2    #
3    #                make_electro
4    #
5    # $Header: make_drc,v 1.2 89/12/13 17:55:57 phil Exp $
6    # trantor verify or cap_extract, mask-mod
7    #####################################################
8    # This script will run an electromigration verification on a block,
9    # and perform the necessary actions on any children which are out of date.
10   #
11   #####################################################
12   # define functions
13   #####################################################
14   usage ()
15   (
16       echo "ERROR: $1" >&2
17       case $scriptname in
18       make_drc )
19           echo "Usage: make_drc [-f] [-x] <block>" >&2 ;;
20       make_cap )
```

```
21          echo "Usage: make_cap [-f] [-x] [-m] <block>" >&2 ;;
22      make_mask )
23          echo "Usage: make_mask [-x] <block>" >&2 ;;
24      make_mebes )
25          echo "Usage: make_mebes [-x] [-a (0.25|0.5)] [-p (1|2)] <block>" >&2 ;;
26      make_conn )
27          echo "Usage: make_conn [-f] [-x] <block>" >&2 ;;
28      make_electro )
29          echo "Usage: make_electro [-f] [-x] -F frequency <block>" >&2 ;;
30      * )
31          echo "INTERNAL ERROR: $scriptname not a valid alias for make_drc" >&2 ;;
32      esac
33      echo
34      exit 1
35  }
36  cleanup_files ()
37  {
38      rm -f $cbmake_log $status_file $summary $bippy_list $bippy_list2
39  }
40  cleanup ()
41  {
42      echo "$scriptname received interrupt... cleaning up" >&2
43      cleanup_files
44      exit 1
45  }
46  ##########################################################################
47  # parse arguments
48  ##########################################################################
49  trap "cleanup" 1 2 3 4 5 6 7 8 10 12 13 14 15 16 17 20
50  # get the action (drc/cap) from the script name
51  scriptname=`basename $0`
52  case "$scriptname" in
53      make_drc) mode=drc ;;
54      make_cap) mode=cap ;;
55      make_electro) mode=electro ;;
56      make_mask) mode=mask ;;
57      make_mebes) mode=mebes ;;
58      make_conn) mode=conn ;;
59      *) usage "internal error"
60  esac
61  debug_mode="-p min"
62  debug_cmd=""
63  mebes_pieces=1
64  mebes_grid=0.25
65  min_flag=FALSE
66  set -- `getopt a:fmxp:F: $*`
67  if [ $? != 0 -o $# -lt 2 ]
68  then
69      usage "illegal syntax"
70  fi
71  for i in $*
72  do
73      case $i in
74      -a) mebes_grid=$2 mebes_grid_set=TRUE; shift 2;;
75      -f) fast_flag="-N"; shift;;
76      -m) min_flag=TRUE; shift;;
77      -p) mebes_pieces=$2 mebes_pieces_set=TRUE; shift 2;;
78      -x) debug_cmd="set -x"; debug_mode="-p status"; shift;;
79      -F) frequency=$2; frequency_set=TRUE;export frequency; shift 2;;
80      --) shift; break;;
81      esac
82  done
83  if [ $# -lt 1 ]
84  then
85      usage "no block specified"
86  elif [ $# -gt 1 ]
87  then
88      usage "extra parameters"
89  fi
90  if [ $mebes_pieces -lt 1 -o $mebes_pieces -gt 2 ]
91  then
92      usage "only choices for -p are 1 or 2"
93  fi
94  if [ "$mebes_pieces_set" -a $mode != mebes ]
95  then
96      usage "-p not permitted here"
97  fi
98  if [ "$mebes_grid_set" -a $mode != mebes ]
99  then
100     usage "-a not permitted here"
101 fi
102 if [ "$fast_flag" -a \( $mode = mask -o $mode = mebes \) ]
103 then
104     usage "-f not permitted here"
105 fi
```

```
106  if [ "$frequency_set" -a $mode != "electro" ]
107  then
108          usage "-F frequency not permitted here"
109  fi
110  if [ "$frequency_set" != "TRUE" -a $mode = "electro" ]
111  then
112          usage "need -F frequency for $(mode)migration mode"
113  fi
114  if [ $min_flag = TRUE -a $mode != cap ]
115  then
116      usage "-m not permitted here"
117  fi
118  if [ "$CBMAKE_NO_STOP" = TRUE -a \( $mode = mask -o $mode = mebes \) ]
119  then
120      unset CBMAKE_NO_STOP
121      echo "Warning: CBMAKE_NO_STOP turned off" >&2
122  fi
123  ###########################################################################
124  # find block, make sure something is there
125  ###########################################################################
126  check_env -c
127  if [ $? != 0 ]
128  then
129      exit 1
130  fi
131  utils_dir=$CBROOT/lib/util
132  block=`$utils_dir/get_dir $1`
133  if [ ! "$block" ]
134  then
135      echo block $1 does not exist
136      exit 1
137  fi
138  # create rep names
139  art_repname=art_$ICPROCESS
140  art_rep=$block/art_$ICPROCESS
141  if [ $min_flag = TRUE ]
142  then
143      cap_rep=$block/mcap_$ICPROCESS
144  else
145      cap_rep=$block/cap_$ICPROCESS
146  fi
147  mask_rep=$block/mask_$ICPROCESS
148  encap_rep=$block/encap_$ICPROCESS
149  error_rep=$block/error_$ICPROCESS
150  electro_rep=$block/electro_$ICPROCESS
151  tm_rep=$block/tm$(mebes_pieces)_$ICPROCESS
152  conn_rep=$block/art_conn
153  if [ ! -d $art_rep ]
154  then
155      echo Warning: rep $art_rep does not exist
156      exit 1
157  fi
158  ###########################################################################
159  # initialize log files
160  ###########################################################################
161  # define log files
162  cbmake_log="$art_rep/cbmake_$$"
163  status_file="$art_rep/ver_stat$$"
164  block_log="$art_rep/drc_log"
165  cap_log="$cap_rep/cap_log"
166  electro_log="$electro_rep/electro_log"
167  ver_sum_file="$art_rep/ver_sum$$"
168  piece_flag=$art_rep/piece_only_flag
169  bippy_list=/tmp/bmdb$$
170  bippy_list2=/tmp/bmdb2$$
171  rm -f $cbmake_log $status_file
172  if [ -r $art_rep/summary ]
173  then
174      mv $art_rep/summary $art_rep/summary.old
175  fi
176  echo "verify of $block did not complete normally" > $status_file
177  echo "INFO: start $mode on block $block at `date` on `hostname`" > $cbmake_log
178  if [ ! -s $cbmake_log ]
179  then
180      echo "can't create cbmake log file: $cbmake_log"
181      cleanup_files
182      exit 1
183  fi
184  # clear blockpath to disable searching
185  SAVEBLOCKPATH=$BLOCKPATH
186  BLOCKPATH=""
187  export BLOCKPATH SAVEBLOCKPATH
188  # check the bm.db
189  bippy -l -r $art_repname $block > $bippy_list
190  if [ $? != 0 ]
191  then
```

```
192     (
193         echo "aborted due to bm.db errors"
194         grep "bad bm.db" $bippy_list
195         echo "run 'bippy -l $block' for more information"
196     ) | tee $art_rep/verify_summary >&2
197     cleanup_files
198     exit 1
199 fi
200 ############################################################################
201 # Select the targets for cbmake based on action to perform and results desired.
202 ############################################################################
203 case $mode in
204 drc)
205     rep=$art_rep
206     target=$art_rep/passed
207     status_target="-F $encap_rep/trantor.db"
208     ;;
209 cap)
210     rep=$cap_rep
211     target=$cap_rep/cap_passed
212     status_target="-F $cap_rep/trantor.db"
213     ;;
214 electro)
215     rep=$electro_rep
216     target=$electro_rep/electro_passed
217     status_target="-F $electro_rep/trantor.db"
218     ;;
219 mask)
220     rep=$mask_rep
221     target=$mask_rep/passed
222     status_target=$target
223     ;;
224 conn)
225     rep=$conn_rep
226     target="$conn_rep/passed"
227     status_target=$target
228     ;;
229 mebes)
230     rep=$tm_rep
231     MEBES_GRID="-a $mebes_grid"
232     export MEBES_GRID
233     target="-F $tm_rep/mebes.out"
234     status_target=$target
235     ;;
236 *)
237     echo "INTERNAL ERROR: invalid mode $mode"
238     exit -1;
239     ;;
240 esac
241 ############################################################################
242 # set up environment
243 ############################################################################
244 # set up CBPROC, if it isn't already
245 CBPROC=${CBPROC:=$CBROOT/$ICPROCESS}
246 export CBPROC
247 # setup script path
248 drc_scriptpath="$CBPROC/scripts/trantor:$CBPROC/scripts/cb:$CBROOT/scripts/cb:$CBPROC/scripts/spicepath"
249 if [ ! "$SCRIPTPATH" ]
250 then
251     SCRIPTPATH=$drc_scriptpath
252 else
253     SCRIPTPATH="$SCRIPTPATH:$drc_scriptpath"
254 fi
255 export SCRIPTPATH
256 # turn off blockpath re-searching
257 BMNOSEARCH=TRUE
258 export BMNOSEARCH
259 # 1.2 stuff
260 #BMVERBOSE=500
261 #export BMVERBOSE
262 # lock timeout = forever
263 locktime="-1"
264 export locktime
265 # set scriptdebug so we get more information on errors
266 scriptdebug=TRUE
267 export scriptdebug
268 # pass in to script info about what command user requested
269 user_make_cmd=make_$mode
270 export user_make_cmd
271 ############################################################################
272 # See if anything's locked.
273 # This is will give a useful error message if the semaphore daemon is down.
274 ############################################################################
275 # Print warning mesages for anything that is locked.
276 # Note that ":" is the null command.
```

```
277  $utils_dir/cb_sem -n $art_rep :
278  if [ $? = 255 ]
279  then
280      echo Warning: art rep is locked, DRC will wait. >&2
281  fi
282  $utils_dir/cb_sem -n $error_rep :
283  if [ $? = 255 ]
284  then
285      echo Warning: error rep is locked, DRC may be forced to wait later. >&2
286  fi
287  $utils_dir/cb_sem $art_rep "rm -f $art_rep/cbmake_log $art_rep/.cbmake_log"
288  # put this here, so it is printed after block was successfully locked.
289  echo "start $mode on block $block at 'date'"
290  ##########################################################################
291  # start cbmake
292  ##########################################################################
293  cbmake_script=art.cbm
294  cmd1="cbmake -ck $debug_mode -f $cbmake_script $fast_flag $target"
295  cmd2="lstarget $status_target > $status_file"
296  # $NICE_TRAN controls niceness
297  nice $NICE_TRAN trantor -f -c "$debug_cmd; trantorrc; $CBROOT/$ICPROCESS/etc/spicepathrc; $cmd1; $cmd2;" >> $cbmake_log 2>&1
298  cat $status_file >> $cbmake_log
299  echo "INFO: end $mode of block $block at 'date'" >> $cbmake_log
300  ##########################################################################
301  # build summary file
302  ##########################################################################
303  : > $ver_sum_file
304  log_list=""
305  if [ -r $block_log ]
306  then
307      log_list="$log_list $block_log"
308  fi
309  if [ -r $cap_log ]
310  then
311      log_list="$log_list $cap_log"
312  fi
313  if [ -r $electro_log ]
314  then
315      log_list="$log_list $electro_log"
316  fi
317  if [ "$log_list" ]
318  then
319      cat $log_list | $utils_dir/nodupe | $utils_dir/rem_spurious >> $ver_sum_file
320  else
321      echo ERROR: something major went wrong during this DRC >&2
322  fi
323  # cbmake_log
324  echo >> $ver_sum_file
325  grep INVALID $cbmake_log | head -20 >> $ver_sum_file
326  echo >> $ver_sum_file
327  $utils_dir/art.cbm.sed < $cbmake_log >> $ver_sum_file
328  if [ -r $piece_flag -a \
329      'grep -c 'is ready as a block piece' $ver_sum_file' = "1" ]
330  then
331      echo "Ready as a block piece."
332      exit_status=0
333  elif [ 'grep -c 'is valid' $status_file' != "1" ]
334  then
335      echo "$mode was unable to complete."
336      exit_status=1
337  elif [ 'grep -c 'Popping target' $cbmake_log' != 0 ]
338  then
339      echo "$mode was unable to complete."
340      exit_status=1
341  elif [ "$fast_flag" ]
342  then
343      echo "fast $mode finished"
344      exit_status=0
345  else
346  #    echo "$mode finished"
347      exit_status=0
348  fi
349  # save permanent copy of cbmake log
350  mv $cbmake_log $art_rep/.cbmake_log
351  rm -f $art_rep/verify_summary
352  mv $ver_sum_file $art_rep/verify_summary
353  # Create job summary file
354  rm -f $art_rep/summary
355  if [ ! -s $bippy_list ]
356  then
357      # file is empty, so put in block's own name
358      echo $block > $bippy_list
359  else
360      sed -e "s/^        /  /" < $bippy_list > $bippy_list2
```

```
361     mv $bippy_list2 $bippy_list
362   fi
363   $utils_dir/hier_status -b bippy_list -s _$(ICPROCESS) > $art_rep/summary$$
364   mv $art_rep/summary$$ $art_rep/summary
365   rm -f $art_rep/summary.old
366   # show error summary
367   if [ `grep -c 'is valid' $status_file` = "1" -a $exit_status = 0 ]
368   then
369       grep '^DRC:' $art_rep/verify_summary
370       grep '^Continuity:' $art_rep/verify_summary
371       grep '^ERC:' $art_rep/verify_summary
372       grep '^Suspicious:' $art_rep/verify_summary
373       grep '^Waiver:' $art_rep/verify_summary
374       grep '^Capacitance:' $art_rep/verify_summary
375       grep '^Electromigration:' $electro_rep/electro_log
376       grep '^Mask:' $art_rep/verify_summary
377       .grep '^Mebes:' $art_rep/verify_summary
378   fi
379   cleanup_files
380   echo "end $mode of block $block at `date`"
381   echo
382   exit $exit_status
1   #
2 · #                       art.cbm
3   #
4   # $Header: art.cbm,v 1.40.1.1 90/07/23 15:18:08 krish Exp $
5   ###########################################################################
6   # cmos artwork verify cbmake script
7   # This script is written in cbmake (part of trantor) and explains the
8   # chain of dependencies needed to perform design rule checks and
9   # capacitance extract. In addition, it includes the script
10  # 'electro.cbm' which gives the necessary instructions to perform the
11  # electromigration verification.
12  # The idea of cbmake is very similar to the unix 'make' facility.
13  ###########################################################################
14  #
15  %default art_cmos26/bp_ready
16  #
17  ###########################################################################
18  # start action
19  ###########################################################################
20  #
21  %start_action
22  (
23  #
24  # set revision target - this can be any value
25      cbmake_art_script_revision="1_May_90"
26      cbmake_cap_script_revision="1_May_90"
27      cbmake_mask_script_revision="1_May_90"
28      cbmake_bias_script_revision="1_May_90"
29  #
30  # Startup action echos useful info.
31      set +E
32      echo STATUS: start cbmake at `date`
33      echo "INFO: \$Header: art.cbm,v 1.40.1.1 90/07/23 15:18:08 phil Exp $"
34      echo INFO: \$SCRIPTPATH=$SCRIPTPATH
35      echo INFO: \$CBMAKE_NO_STOP=$CBMAKE_NO_STOP
36      echo INFO: \$ERC_NO_STOP=$ERC_NO_STOP
37      echo INFO: \$cbmake_art_script_revision=$cbmake_art_script_revision
38      echo INFO: version `version`
39  #
40  #
41  # Set semaphore lock timeout.
42      prevlock=$locktime
43      locktime=(-1)                       # force to be numeric type
44  #
45  # Get hostname and save it for later
46      hostname=`hostname`
47      echo INFO: hostname $hostname
48  #
49  # Set EXPREPLIST for osmosis
50  # The art rep is stuck on the end of the list to keep cbmake from quitting
51  # because of errors in the children.
52      EXPREPLIST=sch_cmos26:sch:art_cmos26
53  #
54  # load schematic revision info
55      revision.cbm
56  #
57  # load standard artwork functions
58      art_funcs
59  #
60  # get shared cbmake functions
61  function exists
62  (
63      echo ( `stat $1` >= 0 )
```

```
64   }
65   function missing
66   {
67       echo ( 'stat $1' < 0 )
68   }
69   function empty_file
70   {
71       echo ( 'stat $1' == 0 )
72   }
73   function newer
74   {
75       local time1 time2 status
76       time1='cbmtime -q -F $1; status=$?'
77       if ( $status != 0 ); then echo 0; exit; fi
78       time2='cbmtime -q -F $2; status=$?'
79       if ( $status != 0 ); then echo 0; exit; fi
80       echo ( $time1 > $time2 )
81   }
82   function sametime
83   {
84       local time1 time2 status
85       time1='cbmtime -q -F $1; status=$?'
86       if ( $status != 0 ); then echo 0; exit; fi
87       time2='cbmtime -q -F $2; status=$?'
88       if ( $status != 0 ); then echo 0; exit; fi
89       echo ( $time1 == $time2 )
90   }
91   function check_for_piece_misuse
92   {
93   # args: list of block/rep/piece_only_flags to check
94   local x y z
95   piece_misuse=FALSE
96   for file in $*
97   do
98   if ( 'stat $file' >= 0 ) ; then
99           x='dirname $file'           # remove target
100          y='dirname $x'              # remove rep name
101          echo ERROR: attempt to use piece as block: $y
102          piece_misuse=TRUE
103  fi
104  done
105  if ( $piece_misuse == TRUE )
106  then
107          exit 1
108  fi
109  }
110  function no_stopping
111  {
112      echo ( "$CBMAKE_NO_STOP" == TRUE )
113  }
114  #
115  # status message function
116  function STATUS
117  {
118      echo "TIMES: 'times'    VMuse='memstat -T'   'date'"
119      echo STATUS: $*
120  }
121  #
122  # define function to filter messages into summary file
123  # args: list of files to summarize
124  #
125  function cbm_summarize
126  {
127      unlink -f $_block/art_cmos26/verify_summary
128      sh cat $* "2>/dev/null |" $CBROOT/lib/util/rem_spurious > $_block/art_cmos26/verify_summary
129  }
130  #
131  # clean up the log files
132  function cbm_clean_logs
133  {
134      unlink -f $_block/art_cmos26/drc_log $_block/cap_cmos26/cap_log $_block/art_cmos26/verify_summary \
135          $_block/art_cmos26/piece_vlog $_block/art_cmos26/block_vlog \
136          $_block/art_cmos26/piece_vlog.old $_block/art_cmos26/block_vlog.old \
137          $_block/art_cmos26/drc_log
138  }
139  #
140  # clean up art rep when source changes
141  function cbm_initial_cleanup
142  {
143      unlink -f $_block/blk_waiv_flag $_block/use_waiv_flag
144      sh clear_block -f -r error -r mask -r bias -r tm1 -r tm2 $_block >> \
145          $_block/art_cmos26/drc_log
146  }
147  #
148  # get value of osmosis property
```

```
149    function get_osmosis_prop
150    {
151        local new_value value
152        # The value is "OSMOSIS" if no value was specified by the user
153        value=`block_prop OSMOSIS`
154        if ( $value == FALSE || $value == false )
155        then
156            new_value=FALSE
157        elif ( $value == TRUE || $value == true )
158        then
159            new_value=TRUE
160        elif ( $value == OSMOSIS )
161        then
162            new_value=FALSE                          # default
163        else
164            echo Error: invalid value for OSMOSIS property: $value
165            echo Valid values are: TRUE and FALSE.
166            new_value=User_Error
167        fi
168        echo $new_value > $_rep/osmosis_flag
169        echo INFO: property osmosis=$new_value
170    }
171    #
172    # get value of waiver property
173    function get_waiver_prop
174    {
175        local new_value
176        value=`block_prop WAIVER`
177        if ( $value == BLOCK || $value == block )
178        then
179            new_value=BLOCK
180        elif ( $value == USE || $value == use )
181        then
182            new_value=USE
183        elif ( $value == "WAIVER" )
184        then
185            # this is what you get if no value was specified by the user
186            new_value=NONE                           # default
187        else
188            echo Error: invalid value for WAIVER property: $value
189            echo Valid values are: BLOCK and USE.
190            new_value=User_Error
191        fi
192        # Destroy existing waiver files, and set new values.
193        unlink -f $_block/blk_waiv_flag $_block/use_waiv_flag
194        case $new_value in
195        BLOCK)
196            unlink -f $_block/use_waiv_flag
197            echo Waiver: from block prop `date` > $_block/blk_waiv_flag
198            ;;
199        USE)
200            unlink -f $_block/blk_waiv_flag
201            echo Waiver: from block prop `date` > $_block/use_waiv_flag
202            ;;
203        esac
204        echo INFO: property waiver=$new_value
205    }
206    #
207    function check_top_level
208    {
209        if ( `block_prop TOP_LEVEL` != TRUE )
210        then
211            if ( "$RET_NOSTOP" != "TRUE" )
212            then
213                echo ERROR: Top level ERC check has not been run >> $_block/art_cmos26/drc_log
214                echo Set property TOP_LEVEL=TRUE in $_blockname >> $_block/art_cmos26/drc_log
215                exit -1
216            else
217                #Jrm wanted this put in for reticle generation in 2 tape scenario
218                echo "WARNING: Top level ERC check has not been run" >> $_block/art_cmos26/drc_log
219                echo "Continuing because RET_NOSTOP is set TRUE" >> $_block/art_cmos26/drc_log
220            fi
221        fi
222    }
223    #
224    function select_rep
225    {
226        local selected_rep=""
227        outlist=$(sh "IFS=: x=$EXPREPLIST ; echo \\$x")
228        for rep in $outlist
229        do
230            if ( `stat $_block/$rep` > 0 )
231            then
232                selected_rep=$rep
233                break
```

```
234        fi
235     done
236     echo $selected_rep
237 }
238 #
239 function no_osmosis
240 {
241     echo ( `cat $_block/art_cmos26/osmosis_flag` == FALSE )
242 }
243 #
244 function yes_osmosis
245 {
246     echo ( `cat $_block/art_cmos26/osmosis_flag` == TRUE )
247 }
248 # make sure there is a trantor.db there
249 function force_trantor_db
250 {
251     if ( `missing $_block/art_cmos26/trantor.db` )
252     then
253         STATUS "rebuild missing $_blockname/art/trantor.db"
254         echo WARNING: $_block/art_cmos26/trantor.db is missing >> $_block/art_cmos26/drc_log
255         sh $CBROOT/lib/util/pig2tran $_block >> $_block/art_cmos26/drc_log 2>&1
256     fi
257 }
258 #
259 function source_is_piglet
260 {
261     source=`sh $CBROOT/lib/util/what_is_src $_block/art_cmos26`
262     echo ( $source == piglet || $source == both )
263 }
264 #
265 #Set the spicepath files needed as targets during cap extract.
266 SPICE_FILE_TARGETS="hier_cap.max hier_cap.nom hier_cap.min cap.sckt"
267 CAP_REV_TARGETS="cbmake_cap_script_revision cbmake_spicepath_revision"
268 SPICE_TMPL_FILE="spice.tmpl"
269 if ("$TRAN_SPICEP" == "TRUE")
270 then
271     if ( "$SIP_substrate_name" == "" )
272     then
273         SIP_substrate_name=SUBSTRATE
274     fi
275     if ( "$SIP_ext_prop_case" == "" )
276     then
277         SIP_ext_prop_case='NOM'
278     fi
279     if ( "$SIP_ext_prop_comp" == "" )
280     then
281         SIP_ext_prop_comp='ZDAWSA1:ZDAWSE1:ZDANSA1:ZDANSE1:ZSUBCP0'
282     fi
283     if ( "$SIP_ext_prop_rep" == "" )
284     then
285         SIP_ext_prop_rep=artprim
286     fi
287     function run_spicepath
288     {
289         local BLOCKPATH EXPREPLIST SpiceLogFile
290         BLOCKPATH=$PRIMPATH
291         EXPREPLIST=cap_cmos26:artprim
292         SpiceLogFile=$(1)/cap_log
293         flatrepsel -C
294         flatrepsel -r $1
295         spiceckt -t cap $1 >> $1/cap_log    2>&1
296         flatrepsel -C
297     }
298 fi
299 #
300 function same_as_last_frequency
301 {
302     savenoexit=$noexit
303     noexit=TRUE
304     sh "touch $_block/electro_cmos26/last_frequency"
305     echo $frequency > /tmp/electro.$Process
306     sh "diff $_block/electro_cmos26/last_frequency /tmp/electro.$Process"
307     if ( $? != 0 )
308     then
309         echo "(frequency has changed since last electromigration check)"
310         echo ""
311             echo $frequency > $_block/electro_cmos26/last_frequency
312             sh "touch $_block/electro_cmos26/defaults"
313     fi
314     unlink /tmp/electro.$Process
315     noexit=$savenoexit
```

```
316    )
317  #
318    )
319  # end of start action
320  #
321  ##############################################################################
322  # exit action
323  ##############################################################################
324  #
325  %exit_action
326  (
327      STATUS "end cbmake"
328  #   print a list of blocks still in memory
329      if ( 'lsrep -T' != 0 ) ; then
330          echo * * * blocks still loaded:
331          lsrep -L
332      fi
333  #   restore lock timeout
334      locktime=$prevlock
335      set -E
336      echo INFO: end cbmake at 'date' on $hostname
337    )
338  #
339  ##############################################################################
340  # This target is the single starting point for artwork.
341  # If source is piglet.db, create trantor.db here.
342  # If tran_src_time exists, don't change its date
343  ##############################################################################
344  #
345  (file) art_cmos26/tran_src_time
346    a
347  (
348      echo INFO: check source file date consistency for $_blockname
349  #   see is file dates are in an unusual state
350      if ( 'newer $_rep/piglet.db $_rep/tran_src_time' )
351      then
352          unlink $_block/art_cmos26/drc_log
353          echo ERROR: piglet.db is newer than tran_src_time >> $_block/art_cmos26/drc_log
354          echo Remove tran_src_time or piglet.db and try again. >> $_block/art_cmos26/drc_log
355          cbm_summarize $_block/art_cmos26/drc_log
356          exit -1
357      fi
358      if ( 'newer $_rep/tran_src_time $_rep/piglet.db' )
359      then
360          unlink $_block/art_cmos26/drc_log
361          echo WARNING: piglet.db is older than tran_src_time >> $_block/art_cmos26/drc_log
362          echo Piglet.db exists, but will be ignored. >> $_block/art_cmos26/drc_log
363          cbm_summarize $_block/art_cmos26/drc_log
364      fi
365    )
366  :   (variable) cbmake_art_script_revision
367  (
368      STATUS "check $_block tran_src_time"
369  # clean up the log files
370      cbm_clean_logs
371      echo INFO: Cbmake target $_repname/$_target >> $_block/art_cmos26/drc_log
372  # destroy other targets
373      cbm_initial_cleanup
374  #
375      echo Start $_blockname at 'date' on $hostname >> $_block/art_cmos26/drc_log
376      if ( 'missing $_rep/tran_src_time' )
377      then
378          # create tran_src_time
379          if ( 'exists $_rep/piglet.db' )
380          then
381              # piglet.db -> trantor.db
382              echo INFO: source is piglet >> $_block/art_cmos26/drc_log
383              sh $CBROOT/lib/util/pig2tran $_block >> $_block/art_cmos26/drc_log 2>&1
384          elif ( 'exists $_rep/trantor.db' )
385          then
386              echo INFO: source is trantor >> $_block/art_cmos26/drc_log
387              sh touch $_rep/tran_src_time
388          else
389              echo ERROR: no source for $_blockname >> $_block/art_cmos26/drc_log
390              exit -1
391          fi
392          echo INFO: created tran_src_time >> $_block/art_cmos26/drc_log
393      else
394          echo INFO: tran_src_time already exists >> $_block/art_cmos26/drc_log
395          if ( 'exists $_rep/trantor.db' )
396          then
397              echo INFO: source is trantor >> $_block/art_cmos26/drc_log
398          elif ( 'sametime $_rep/piglet.db $_rep/tran_src_time' )
399          then
400              echo INFO: source is piglet >> $_block/art_cmos26/drc_log
```

```
401            # piglet.db -> trantor.db
402            sh $CBROOT/lib/util/pig2tran $_block >> $_block/art_cmos26/drc_log 2>&1
403        else
404            echo ERROR: trantor should be source, but no trantor.db exists \
405                >> $_block/art_cmos26/drc_log
406            exit -1
407        fi
408    fi
409  # make sure there is a trantor.db there
410    if ( 'missing $_rep/trantor.db' )
411    then
412        echo INTERNAL ERROR: $_rep/trantor.db is missing >> $_block/art_cmos26/drc_log
413        cbm_summarize $_block/art_cmos26/drc_log
414        exit -1
415    fi
416  } ;
417  #
418  ##############################################################################
419  # The hierarchy files are built now which contain block names:
420  #    piece_hier = included block pieces
421  # Two other files are created here to avoid snowballing error messages:
422  #    osmosis_flag and block_hier
423  # The variable cbmake_art_script_revision is a dependency again here,
424  # because the tran_src_time file may be rebuilt but not change date.
425  ##############################################################################
426  #
427  (file) art_cmos26/piece_hier
428  : (file) art_cmos26/tran_src_time
429    (variable) cbmake_art_script_revision
430  {
431      STATUS "build piece_hier for $_blockname"
432      echo INFO: Cbmake target $_repname/$_target >> $_block/art_cmos26/drc_log
433      unlink -f $_rep/piece_hier
434  # make sure there is a trantor.db there
435      force_trantor_db
436  # make lists
437      get $_rep
438      lshier -pB > $_rep/piece_hier
439  # bug in lshier may cause duplicate blocks
440      sh sort -u -o $_rep/piece_hier $_rep/piece_hier
441  # Check piece_only_flag for the included blocks.
442      STATUS "check for piece misuse in $_blockname"
443      for e in 'lshier -rP'
444      do
445          #The following ugly check has been put in to take care of blocks
446          #being copied to long filename discs in future.
447          if ( $( exists $(dirname $e)/art_cmos26/piece_only_flag ) || \
448               $( exists $(dirname $e)/art_cmos26/piece_only_fla ) )
449          then
450              echo "ERROR: $e has been added to $_blockname as an encap,\n\
451                  but it is marked with a piece_only_flag.\n\
452                  In piglet, add pieces with no suffix or a P suffix" >> $_block/art_cmos26/drc_log
453              exit -1
454          fi
455      done
456  # create bogus block_hier - make real one later
457      lshier -rB > $_rep/block_hier
458  # create bogus osmosis_flag - make real one later
459      echo FALSE > $_rep/osmosis_flag
460  } ;
461  #
462  ##############################################################################
463  # This is where the existence of included blocks and pieces is ensured.
464  # Pieces need no further processing.
465  # The bp_ready target must change dates if the source data changes.
466  # I depend on passed, not because it is needed yet, but to force each block
467  # to be completed before going on to the next block.
468  ##############################################################################
469  #
470  %action make_piece
471  {
472      echo INFO: Cbmake target $_repname/$_target >> $_block/art_cmos26/drc_log
473      STATUS "check for pieces used as blocks in $_blockname"
474      for ablock in 'cat $_rep/piece_hier'
475      do
476          locked_block='lsrep -l $ablock/art_cmos26 2>/dev/null; count=$?'
477          if ( $count > 0 )
478          then
479  #           Block is locked and used as a piece. Unlock it now, or else
480  #           it will be locked until trantor exits.
481              STATUS "flush piece $ablock"
482              flush -f $locked_block
483          fi
484      done
485      echo Piece: ready as a block piece at 'date' >> $_block/art_cmos26/drc_log
```

```
486        STATUS "$_blockname is ready as a block piece"
487   # clean up log file
488        sh $CBROOT/lib/util/rm_dup_mess $_block/art_cmos26/drc_log
489        cbm_summarize $_block/art_cmos26/drc_log
490   )
491   #
492   art_cmos26/bp_ready
493   :    (file) art_cmos26/piece_hier
494            `cat $_rep/piece_hier`/art_cmos26/bp_ready
495        %invoke make_piece
496   & {
497        if ( $_target_valid ) ; then
498            echo INFO: $_block is ready as a piece
499        fi
500   } ;
501   #
502   ############################################################################
503   # Descend the block-piece hierarchy and force the trantor.dbs to exist.
504   ############################################################################
505   #
506   art_cmos26/piece_db
507   @ {
508        force_trantor_db
509   }
510   : (file) art_cmos26/piece_hier
511            `cat $_rep/piece_hier`/art_cmos26/piece_db
512   {
513        STATUS "all piece trantor.db's exist below $_blockname"
514        echo INFO: Cbmake target $_repname/$_target >> $_block/art_cmos26/drc_log
515   } ;
516   #
517   ############################################################################
518   # Extract the osmosis property from the block and store it in a file.
519   # Create block hierarchy file
520   ############################################################################
521   #
522   (file) art_cmos26/osmosis_flag
523        (file) art_cmos26/block_hier
524   :        art_cmos26/bp_ready
525        %next_option
526   |        art_cmos26/piece_db
527            art_cmos26/bp_ready
528   {
529        STATUS "$_blockname osmosis_flag"
530        echo INFO: Cbmake target $_repname/$_target >> $_block/art_cmos26/drc_log
531   # check properties
532        get $_rep
533        STATUS "plup properties for $_blockname"
534        plupflush
535        plupclear
536        plupset -c block.prop BLOCK.PROP
537        plup
538        STATUS "check for scaled instances or plupies"
539        if (( `lshier -lsTu` > 0 ) || ( `lshier -lsTr` > 0 ))
540        then
541            echo "ERROR: $_rep has scaled realis or plupies.  Only scaled pieces are allowed" >> $_block/art_cmos26/drc_log
542            exit -1
543        fi
544        STATUS "evaluate properties"
545        evalclear
546        evalsetclass -b BLOCK.PROP
547        evalsetclass -b block.prop
548        evalprops
549        get_osmosis_prop >> $_block/art_cmos26/drc_log
550        get_waiver_prop >> $_block/art_cmos26/drc_log
551   # make block hier
552        STATUS "block_hier $_blockname"
553        unlink -f $_rep/block_hier
554        lshier -ruB > $_rep/block_hier
555   # remove layers, classes, and properties we just created
556        evalclear
557        rm -c BLOCK.PROP
558   # clear this stuff, since drc is no longer valid
559        rm -l CBMAKE_ENCAP_READY 2>/dev/null
560   # save bogus trantor.db, so bm.db gets updated
561   # This also saves the plupies, so block management stays happy.
562        sh rm -rf $_block/mask_cmos26
563        save -n $_block/mask_cmos26
564        unlink -f $_block/mask_cmos26/trantor.db
565   # remove the plup sets and pluppies
566        plupclear
567        plupflush
568   # change block to readonly so it can be swapped out by trantor
569        get -r $_rep
570   } ;
```

```
571   #
572   art_cmos26/osmosis_ready
573    :       (file) art_cmos26/osmosis_flag
574            (file) art_cmos26/block_hier
575            (assert) 'no_osmosis'
576            'cat $_rep/block_hier'/art_cmos26/osmosis_ready %hierarchical
577       %next_option
578    |       (file) art_cmos26/osmosis_flag
579            (file) art_cmos26/block_hier
580            (assert) 'no_osmosis'
581            'cat $_rep/block_hier'/art_cmos26/osmosis_ready %hierarchical
582            (file) 'cat $_rep/block_hier'/encap_cmos26/trantor.db %hierarchical
583    {
584        echo INFO: Cbmake target $_repname/$_target >> $_block/art_cmos26/drc_log
585        STATUS "no osmosis for $_blockname"
586    }
587    |       (file) art_cmos26/osmosis_flag
588            (file) art_cmos26/block_hier
589            (assert) 'missing $_block/sch'
590            (assert) 'missing $_block/sch_cmos26'
591            (assert) 'yes_osmosis'
592            'cat $_rep/block_hier'/art_cmos26/osmosis_ready %hierarchical
593            (file) 'cat $_rep/block_hier'/encap_cmos26/trantor.db %hierarchical
594    {
595        echo INFO: Cbmake target $_repname/$_target >> $_block/art_cmos26/drc_log
596        STATUS "osmosis requested, but no sch reps for $_blockname"
597    }
598    |       (file) art_cmos26/osmosis_flag
599            (file) art_cmos26/block_hier
600            [*]/osmosis_sources
601            (assert) 'yes_osmosis'
602            'cat $_rep/block_hier'/art_cmos26/osmosis_ready %hierarchical
603            (file) 'cat $_rep/block_hier'/encap_cmos26/trantor.db %hierarchical
604    {
605        echo INFO: Cbmake target $_repname/$_target >> $_block/art_cmos26/drc_log
606        STATUS "sch reps exist for $_blockname"
607    }
608    |       (file) art_cmos26/osmosis_flag
609            (file) art_cmos26/block_hier
610            (assert) 'yes_osmosis'
611            'cat $_rep/block_hier'/art_cmos26/osmosis_ready %hierarchical
612            (file) 'cat $_rep/block_hier'/encap_cmos26/trantor.db %hierarchical
613    {
614        echo INFO: Cbmake target $_repname/$_target >> $_block/art_cmos26/drc_log
615        STATUS "bad sch reps for $_blockname"
616    } ;
617   #
618   ##########################################################################
619   # This section runs DRC and ERC on blocks.
620   # The results of this action are an art trantor.db with derived data.
621   # A special layer is created as the timestamp for DRC completion.
622   ##########################################################################
623   #
624   %action run_drc
625   {
626        STATUS "Start verify of $_blockname"
627        echo INFO: Cbmake target $_repname/$_target >> $_block/art_cmos26/drc_log
628   # clear log files
629        unlink -f $_block/cap_cmos26/cap_log $_block/art_cmos26/verify_summary
630   # see if this block can only be used as a piece
631        #The following ugly check has been put in to take care of blocks
632        #being copied to long filename discs in future.
633        if ( ('stat $_rep/piece_only_flag' >= 0) || \
634             ('stat $_rep/piece_only_fla' >= 0)) ; then
635            echo ERROR: $_blockname may only be used as a block piece >> $_block/art_cmos26/drc_log
636            cbm_summarize $_block/art_cmos26/drc_log
637            exit -1
638        fi
639   # determine osmosis rep
640        echo "INFO: OSMOSIS deps= $(_deps[1]) $(_deps[2]) $(_deps[3]) $(_deps[4]) $(_deps[5]) $(_deps[6])" >> $_block/art_cmos26/drc_log
641        if ( "$(_deps[5])" == "\'no_osmosis\'" )
642        then
643            osmosis_rep="none"
644        elif ( "$(_deps[5])" == "\'missing \$_block/sch\'" )
645        then
646            osmosis_rep="bad"
647        elif ( "$(_deps[5])" == "\'yes_osmosis\'" )
648        then
649            osmosis_rep="bad"
650        else
651            osmosis_rep=$(basename $(dirname $(_deps[5]) ))
652            if ( 'substr $osmosis_rep 1 3' != sch )
653            then
654                echo ERROR: bad osmosis rep selected for $_blockname : $osmosis_rep
655                exit -1
```

```
656         fi
657     fi
658     echo INFO: osmosis_rep = $osmosis_rep >> $_block/art_cmos26/drc_log
659     case $osmosis_rep in
660         none) osmosis_arg="" ;;
661         sch) osmosis_arg="-osmosis_rep sch" ;;
662         sch_cmos26) osmosis_arg="-osmosis_bdl sch_cmos26/sclp_bdl" ;;
663         bad) osmosis_arg="-osmosis_bad" ;;
664     esac
665 #
666     echo Start verify of $_blockname at 'date' on $hostname >> $_block/art_cmos26/drc_log
667     echo INFO: begin Trantor VM use: 'memstat -T' >> $_block/art_cmos26/drc_log
668     echo INFO: begin Trantor Time: 'times' >> $_block/art_cmos26/drc_log
669     get -l $_block/art_cmos26 >> $_block/art_cmos26/drc_log
670     art_vrfy check $osmosis_arg >> $_block/art_cmos26/drc_log 2>&1
671 # write drc errors to stdout
672     art_rprt -s >> $_block/art_cmos26/drc_log 2>&1
673 # add layer which serves as an indicator that DRC has been run.
674     dilayer CBMAKE_ENCAP_READY >> $_block/art_cmos26/drc_log
675 # copy out the DRC messages
676     sh $CBROOT/lib/util/rm_dup_mess $_block/art_cmos26/drc_log
677     cbm_summarize $_block/art_cmos26/drc_log
678 )
679 #
680 # The art rep must exist before this target is checked.  A preaction here
681 # is too late.
682 # The dependency on 'passed' here is to prevent DRC from starting if
683 # the children have failed.
684 #
685 (layer) art_cmos26/CBMAKE_ENCAP_READY
686     :       art_cmos26/piece_db
687             art_cmos26/osmosis_ready
688             (file) art_cmos26/block_hier
689             'cat $_block/art_cmos26/block_hier'/art_cmos26/passed %hierarchical
690             (assert) 'no_osmosis'
691     %invoke run_drc
692     |       art_cmos26/piece_db
693             art_cmos26/osmosis_ready
694             (file) art_cmos26/block_hier
695             'cat $_block/art_cmos26/block_hier'/art_cmos26/passed %hierarchical
696             (assert) 'missing $_block/sch'
697             (assert) 'missing $_block/sch_cmos26'
698             (assert) 'yes_osmosis'
699     %invoke run_drc
700     |       art_cmos26/piece_db
701             art_cmos26/osmosis_ready
702             (file) art_cmos26/block_hier
703             'cat $_block/art_cmos26/block_hier'/art_cmos26/passed %hierarchical
704             [*]/osmosis_input
705             (assert) 'yes_osmosis'
706     %invoke run_drc
707     |       art_cmos26/piece_db
708             art_cmos26/osmosis_ready
709             (file) art_cmos26/block_hier
710             'cat $_block/art_cmos26/block_hier'/art_cmos26/passed %hierarchical
711             (assert) 'yes_osmosis'
712     %invoke run_drc
713     |       art_cmos26/piece_db
714             art_cmos26/osmosis_ready
715             (file) art_cmos26/block_hier
716             (file) 'cat $_rep/block_hier'/encap_cmos26/trantor.db %hierarchical
717             (assert) 'no_osmosis'
718             (assert) 'no_stopping'
719     %invoke run_drc
720     |       art_cmos26/piece_db
721             art_cmos26/osmosis_ready
722             (file) art_cmos26/block_hier
723             (file) 'cat $_rep/block_hier'/encap_cmos26/trantor.db %hierarchical
724             (assert) 'missing $_block/sch'
725             (assert) 'missing $_block/sch_cmos26'
726             (assert) 'yes_osmosis'
727             (assert) 'no_stopping'
728     %invoke run_drc
729     |       art_cmos26/piece_db
730             art_cmos26/osmosis_ready
731             (file) art_cmos26/block_hier
732             (file) 'cat $_rep/block_hier'/encap_cmos26/trantor.db %hierarchical
733             [*]/osmosis_input
734             (assert) 'yes_osmosis'
735             (assert) 'no_stopping'
736     %invoke run_drc
737     |       art_cmos26/piece_db
738             art_cmos26/osmosis_ready
739             (file) art_cmos26/block_hier
740             (file) 'cat $_rep/block_hier'/encap_cmos26/trantor.db %hierarchical
```

```
741         (assert) 'yes_osmosis'
742         (assert) 'no_stopping'
743     %invoke run_drc
744 # postaction to unlock in case of error
745 & (
746     if ( $_target_valid ) ; then
747         echo INFO: $_block has been DRCed, results in verify_summary
748     else
749         locked_block=`lsrep -l $_rep; count=$?`
750         if ( $count > 0 )
751         then
752 #           Block is locked and target is invalid, so DRC died.
753 #           There is no point in keeping this block in memory.
754             STATUS "flush $_block due to errors"
755             flush -f $locked_block
756         fi
757         sh $CBROOT/lib/util/rm_dup_mess $_block/art_cmos26/drc_log
758         cbm_summarize $_block/art_cmos26/drc_log
759     fi
760 ) ;
761 #
762 # make the encap
763 (file) encap_cmos26/trantor.db
764     :       art_cmos26/osmosis_ready
765     %next_option
766     |       art_cmos26/osmosis_ready
767             art_cmos26/piece_db    # forces art rep to exist
768             (layer) art_cmos26/CBMAKE_ENCAP_READY
769 (
770     STATUS "make encap for $_blockname"
771     echo INFO: Cbmake target $_repname/$_target >> $_block/art_cmos26/drc_log
772     get -l $_block/art_cmos26
773     art_encap >> $_block/art_cmos26/drc_log 2>&1
774 # Clean up log file
775     sh $CBROOT/lib/util/rm_dup_mess $_block/art_cmos26/drc_log
776     cbm_summarize $_block/art_cmos26/drc_log
777 ) ;
778 # cleanup temporary layers
779 (file) art_cmos26/trantor.db
780     :       art_cmos26/osmosis_ready
781     %next_option
782     |       art_cmos26/osmosis_ready
783             art_cmos26/piece_db # forces art rep to exist
784             (layer) art_cmos26/CBMAKE_ENCAP_READY
785             (file) encap_cmos26/trantor.db
786 (
787     STATUS "post-drc cleanup $_blockname"
788     echo INFO: Cbmake target $_repname/$_target >> $_block/art_cmos26/drc_log
789     get -l $_rep >> $_block/art_cmos26/drc_log
790     art_chkprp >> $_block/art_cmos26/drc_log 2>&1
791     art_rprt >> $_block/art_cmos26/drc_log 2>&1
792     art_clnup >> $_block/art_cmos26/drc_log 2>&1
793     rm -l CBMAKE_ENCAP_READY
794     save $_rep >> $_block/art_cmos26/drc_log
795     echo end verify of $_blockname at `date` >> $_block/art_cmos26/drc_log
796 # change to read-only mode to unlock
797     get -r $_rep >> $_block/art_cmos26/drc_log
798 # flush the encaps we used to save VM
799     encaps=`lshier */encap_cmos26`
800     if ("$encaps" != "")
801     then
802         STATUS "flush encaps $encaps"
803         flush -f $encaps
804     fi
805     echo INFO: end Trantor VM use: `memstat -T` >> $_block/art_cmos26/drc_log
806     echo INFO: end Trantor Time: `times` >> $_block/art_cmos26/drc_log
807     STATUS "end verify of $_blockname"
808 # clean up log file
809     sh $CBROOT/lib/util/rm_dup_mess $_block/art_cmos26/drc_log
810     cbm_summarize $_block/art_cmos26/drc_log
811 ) ;
812 #
813 ##########################################################################
814 # create bdl.out file
815 ##########################################################################
816 #
817 (file) art_cmos26/bdl.out
818     :       art_cmos26/osmosis_ready
819     %next_option
820     |       art_cmos26/osmosis_ready
821             (file) art_cmos26/block_hier
822             (file) `cat $_rep/block_hier`/encap_cmos26/trantor.db %hierarchical
823             (file) art_cmos26/trantor.db
824 (
825 # make bdl.out
```

```
826        STATUS "output bdl $_blockname"
827        echo INFO: Cbmake target $_repname/$_target >> $_block/art_cmos26/drc_log
828        unlink -f $_block/art_cmos26/bdl.out
829        get -r $_rep
830        # force included reps to be encaps
831        makerep encap_cmos26 -T art_cmos26
832        lbdlout -C -p SIGTYPE S_TYPE > /tmp/bdl.$Process
833        sh $CBROOT/lib/util/gen_signallist < /tmp/bdl.$Process > $_block/art_cmos26/bdl.out
834        unlink -f /tmp/bdl.$Process
835    } ;
836    #
837    ##############################################################################
838    # Create piglet.db for error rep, if source for block is piglet.
839    ##############################################################################
840    #
841    (file) error_cmos26/piglet.db
842    :      art_cmos26/osmosis_ready
843        %next_option
844    |      art_cmos26/osmosis_ready
845           (file) art_cmos26/trantor.db
846           (assert) 'source_is_piglet'
847    {
848        STATUS "output piglet error device for $_blockname"
849        echo INFO: Cbmake target $_repname/$_target >> $_block/art_cmos26/drc_log
850        unlink -f $_block/error_cmos26/piglet.arc $_block/error_cmos26/piglet.db \
851            $_block/error_cmos26/trantor.db
852        sh ln $_block/art_cmos26/trantor.db $_block/error_cmos26/trantor.db \&& \
853            $CBROOT/lib/util/tran2pig -error $_block >> $_block/art_cmos26/drc_log 2>&1
854        unlink -f $_block/error_cmos26/trantor.db $_block/error_cmos26/tran_src_time
855    } ;
856    #
857    ##############################################################################
858    # Create piglet.db for encap rep
859    ##############################################################################
860    #
861    (file) encap_cmos26/piglet.db : (file) encap_cmos26/trantor.db
862    {
863        echo INFO: Cbmake target $_repname/$_target >> $_block/art_cmos26/drc_log
864        STATUS "output piglet encap for $_blockname"
865        sh $CBROOT/lib/util/tran2pig -encap $_block
866    # throw away the encap archive
867        unlink -f $_block/encap_cmos26/piglet.arc
868    } ;
869    #
870    ##############################################################################
871    # Decide if the block has (1) no errors, (2) soft errors, or (3) hard
872    # errors.  A block will pass if it has no errors, or it has soft errors
873    # and is waivered.
874    ##############################################################################
875    #
876    art_cmos26/no_hard_errors
877    :      (file) ./blk_waiv_flag %optional
878           (file) ./use_waiv_flag %optional
879           (file) 'cat $_block/art_cmos26/block_hier'/./use_waiv_flag %optional
880           art_cmos26/osmosis_ready
881        %next_option
882    |      (file) ./blk_waiv_flag %optional
883           (file) ./use_waiv_flag %optional
884           (file) 'cat $_block/art_cmos26/block_hier'/./use_waiv_flag %optional
885           art_cmos26/osmosis_ready
886           (file) art_cmos26/trantor.db
887    {
888        STATUS "check for unwaiverable (hard) errors in $_blockname"
889        echo INFO: Cbmake target $_repname/$_target >> $_block/art_cmos26/drc_log
890        get -r $_block/art_cmos26
891        art_rprt -e
892        e_status=$?
893        if ( $e_status == 0 ) ; then
894            echo INFO: block has no errors >> $_block/art_cmos26/drc_log
895            h_status=0
896        else
897            art_rprt -h
898            h_status=$?
899            if ( $h_status == 0 ) ; then
900                echo Waiver: block has waiverable errors >> $_block/art_cmos26/drc_log
901            else
902                echo Waiver: block has unwaiverable errors >> $_block/art_cmos26/drc_log
903                cbm_summarize $_block/art_cmos26/drc_log
904                exit -1
905            fi
906        fi
907    # see which waivers exist for this block
908        STATUS "check for existing waivers in $_blockname"
909        b_waiver=0
910        u_waiver=0
```

```
911         waiver=0
912         if ( `exists $_block/blk_waiv_flag' )
913         then
914             echo block waiver flag set >> $_block/art_cmos26/drc_log
915             echo Waiver: block is waivered >> $_block/art_cmos26/drc_log
916             b_waiver=1
917             waiver=1
918         elif ( `exists $_block/use_waiv_flag' )
919         then
920             echo usage waiver flag set >> $_block/art_cmos26/drc_log
921             echo Waiver: block is use-waivered >> $_block/art_cmos26/drc_log
922             u_waiver=1
923             waiver=1
924         fi
925  #
926         if( $e_status != 0 && $waiver == 0 )
927         then
928             echo INFO: block has unwaivered errors >> $_block/art_cmos26/drc_log
929             exit -1
930         fi
931  #
932         STATUS "check $_blockname for children with use-waivers"
933         child_has_waiver=FALSE
934         for file in $(_deps[3])
935         do
936             if ( `stat $file' >= 0 ) ; then
937                 echo child of $_blockname has usage waiver: $(basename $(dirname $(dirname $file ))) >> $_block/art_cmos26/drc_log
938                 child_has_waiver=TRUE
939             fi
940         done
941  #
942         if ( $child_has_waiver == TRUE && $waiver == 0 )
943         then
944             echo Waiver: block must be waivered because of children >> $_block/art_cmos26/drc_log
945             flush -f $_block/art_cmos26
946             cbm_summarize $_block/art_cmos26/drc_log
947             exit -1
948         fi
949  ) ;
950  #
951  ###############################################################################
952  # Mark the block as passed.
953  ###############################################################################
954  #
955  %action pass_block
956  (
957         STATUS "$_blockname passed"
958         echo INFO: Cbmake target $_repname/$_target >> $_block/art_cmos26/drc_log
959         echo drc finished and passed >> $_block/art_cmos26/drc_log
960         cbm_summarize $_block/art_cmos26/drc_log
961         if ( "$user_make_cmd" == make_drc )
962         then
963             STATUS "flush $_rep, as it is done"
964             flush -f $_block/art_cmos26
965         fi
966  )
967  #
968  art_cmos26/passed :
969         (file) art_cmos26/block_hier
970         `cat $_block/art_cmos26/block_hier`/art_cmos26/passed %hierarchical
971         (file) art_cmos26/bdl.out
972         (file) encap_cmos26/piglet.db
973         art_cmos26/no_hard_errors
974         (file) error_cmos26/piglet.db
975     %invoke pass_block
976  |     (file) art_cmos26/block_hier
977         `cat $_block/art_cmos26/block_hier`/art_cmos26/passed %hierarchical
978         (file) art_cmos26/bdl.out
979         (file) encap_cmos26/piglet.db
980         art_cmos26/no_hard_errors
981     %invoke pass_block
982  & (
983         if ( $_target_valid ) ; then
984             echo "INFO: $_block passed"
985         fi
986  ) ;
987  #
988  ###############################################################################
989  # Build conectivity rep
990  ###############################################################################
991  #
992  (file) art_conn/block_hier : (file) art_cmos26/block_hier
993  (
994         STATUS "$_blockname/conn block_hier"
995         echo INFO: Cbmake target $_repname/$_target >> $_block/art_cmos26/drc_log
996         cat $_block/art_cmos26/block_hier > $_block/art_conn/block_hier
```

```
997   ) ;
998   #
999   (file) art_conn/trantor.db
1000  :       art_cmos26/osmosis_ready
1001  %next_option
1002  |       art_cmos26/osmosis_ready
1003          (file) art_conn/block_hier
1004          (file) `cat $_rep/block_hier`/art_conn/trantor.db %hierarchical
1005          (file) art_cmos26/bdl.out
1006  {
1007      STATUS "build connectivity rep for $_blockname"
1008      echo INFO: Cbmake target $_repname/$_target >> $_block/art_cmos26/drc_log
1009      sh cd $_block/.. \; \
1010          bdltocb -m $CBROOT/etc/bdl.mapfile -r art_conn:artprim -o art_conn \
1011          $_block/art_cmos26/bdl.out >> $_block/art_cmos26/drc_log 2>&1
1012  ) ;
1013  #
1014  art_conn/passed
1015  :       (file) art_conn/block_hier
1016          `cat $_rep/block_hier`/art_conn/passed %hierarchical
1017          art_cmos26/passed
1018          (file) art_conn/trantor.db
1019  {
1020      STATUS "connectivity rep completed for $_blockname"
1021      echo INFO: Cbmake target $_repname/$_target >> $_block/art_cmos26/drc_log
1022      sh $CBROOT/lib/util/rm_dup_mess $_block/art_cmos26/drc_log
1023      cbm_summarize $_block/art_cmos26/drc_log $_block/cap_cmos26/cap_log
1024  ) ;
1025  #
1026  #####################################################################
1027  # make pre-biased mask data
1028  #####################################################################
1029  #
1030  %action make_mask_rep
1031  {
1032      STATUS("Start pre-bias mask generation for $_blockname") ;
1033      echo INFO: Cbmake target $_repname/$_target >> $_block/art_cmos26/drc_log
1034      echo INFO: begin pre-bias mask generation for $_block >> $_block/art_cmos26/drc_log
1035      unlink -f $_block/mask_cmos26/archive.trp
1036      get -r $_block/art_cmos26
1037      art_mkmsk >> $_block/art_cmos26/drc_log
1038      flush -f $_block/art_cmos26
1039      echo Mask: pre-bias mask generation complete >> $_block/art_cmos26/drc_log
1040      sh $CBROOT/lib/util/rm_dup_mess $_block/art_cmos26/drc_log
1041      cbm_summarize $_block/art_cmos26/drc_log $_block/cap_cmos26/cap_log
1042  }
1043  #
1044  (file) mask_cmos26/trantor.db :
1045          (variable) cbmake_mask_script_revision
1046          art_cmos26/osmosis_ready
1047      %next_option
1048  |       (variable) cbmake_mask_script_revision
1049          art_cmos26/osmosis_ready
1050          (file) art_cmos26/block_hier
1051          (file) `cat $_block/art_cmos26/block_hier`/mask_cmos26/trantor.db %hierarchical
1052          (file) `cat $_block/art_cmos26/block_hier`/encap_cmos26/trantor.db %hierarchical
1053          art_cmos26/passed
1054          (file) art_cmos26/trantor.db
1055      %invoke make_mask_rep
1056  |       (variable) cbmake_mask_script_revision
1057          art_cmos26/osmosis_ready
1058          (file) art_cmos26/block_hier
1059          (file) `cat $_block/art_cmos26/block_hier`/mask_cmos26/trantor.db %hierarchical
1060          (file) `cat $_block/art_cmos26/block_hier`/encap_cmos26/trantor.db %hierarchical
1061          (assert) 'no_stopping'
1062          (file) art_cmos26/trantor.db
1063      %invoke make_mask_rep
1064  ;
1065  #
1066  mask_cmos26/passed
1067  :       (file) art_cmos26/block_hier
1068          `cat $_block/art_cmos26/block_hier`/mask_cmos26/passed %hierarchical
1069          (file) mask_cmos26/trantor.db
1070          art_cmos26/no_hard_errors
1071  {
1072      STATUS("Completed pre-bias mask generation for $_blockname") ;
1073      # Insure that piglet is the source before saving tons of disk space
1074      if ( $(source_is_piglet) && $(missing $_block/art_cmos26/piece_maybe_flag) \
1075                      && $(missing $_block/art_cmos26/piece_maybe_fl) )
1076      then
1077          echo INFO: NOT Removing useless art trantor.db to save massive amounts of disk space. >> $_block/art_cmos26/drc_log
1078  #       unlink -f $_block/art_cmos26/trantor.db
1079      fi
1080      echo INFO: Cbmake target $_repname/$_target >> $_block/art_cmos26/drc_log
```

```
1081    )
1082    & (
1083        if ( $_target_valid )
1084        then
1085            echo INFO: $_block has valid pre-bias mask data
1086        fi
1087    ) ;
1088    #
1089    ########################################################################
1090    # make biased mask data
1091    ########################################################################
1092    #
1093    %action make_bias_rep
1094    (
1095        STATUS("Start biased mask generation for $_blockname") ;
1096        echo INFO: Cbmake target $_repname/$_target >> $_block/art_cmos26/drc_log
1097        echo INFO: begin biased mask generation for $_block >> $_block/art_cmos26/drc_log
1098        get -r $_block/mask_cmos26
1099        art_mkbias >> $_block/art_cmos26/drc_log
1100        flush -f $_block/mask_cmos26
1101        echo Mask: Biased mask generation complete >> $_block/art_cmos26/drc_log
1102        sh $CBROOT/lib/util/rm_dup_mess $_block/art_cmos26/drc_log
1103        cbm_summarize $_block/art_cmos26/drc_log $_block/cap_cmos26/cap_log
1104    )
1105    #
1106    (file) bias_cmos26/trantor.db :
1107            (variable) cbmake_bias_script_revision
1108            art_cmos26/osmosis_ready
1109        %next_option
1110    |       (variable) cbmake_bias_script_revision
1111            art_cmos26/osmosis_ready
1112            (file) art_cmos26/block_hier
1113            (file) `cat $_block/art_cmos26/block_hier`/bias_cmos26/trantor.db %hierarchical
1114            (file) `cat $_block/art_cmos26/block_hier`/mask_cmos26/trantor.db %hierarchical
1115            mask_cmos26/passed
1116            (file) mask_cmos26/trantor.db
1117        %invoke make_bias_rep
1118    |       (variable) cbmake_bias_script_revision
1119            art_cmos26/osmosis_ready
1120            (file) art_cmos26/block_hier
1121            (file) `cat $_block/art_cmos26/block_hier`/bias_cmos26/trantor.db %hierarchical
1122            (file) `cat $_block/art_cmos26/block_hier`/mask_cmos26/trantor.db %hierarchical
1123            (assert) 'no_stopping'
1124            (file) mask_cmos26/trantor.db
1125        %invoke make_bias_rep
1126    ;
1127    #
1128    bias_cmos26/passed
1129    :       (file) art_cmos26/block_hier
1130            `cat $_block/art_cmos26/block_hier`/bias_cmos26/passed %hierarchical
1131            (file) bias_cmos26/trantor.db
1132            art_cmos26/no_hard_errors
1133    (
1134        STATUS("Completed biased mask generation for $_blockname") ;
1135        echo INFO: Cbmake target $_repname/$_target >> $_block/art_cmos26/drc_log
1136    )
1137    & (
1138        if ( $_target_valid )
1139        then
1140            echo INFO: $_block has valid biased mask data
1141        fi
1142    ) ;
1143    #
1144    ########################################################################
1145    # make top mask data for a 1-tape chip release
1146    ########################################################################
1147    #
1148    (file) tm1_cmos26/trantor.db :
1149            (variable) cbmake_bias_script_revision
1150            (file) art_cmos26/block_hier
1151            `cat $_block/art_cmos26/block_hier`/bias_cmos26/passed %hierarchical
1152            (file) `cat $_block/art_cmos26/block_hier`/mask_cmos26/trantor.db %hierarchical
1153            mask_cmos26/passed
1154            (file) mask_cmos26/trantor.db
1155    (
1156    # make special bias rep for top block
1157        STATUS "Start final biased mask generation of $_blockname for single tape"
1158        echo INFO: Cbmake target $_repname/$_target >> $_block/art_cmos26/drc_log
1159        echo INFO: begin final biased mask generation for $_block >> $_block/art_cmos26/drc_log
1160        get -r $_block/mask_cmos26
1161        check_top_level
1162        art_mkbias -t >> $_block/art_cmos26/drc_log
1163        echo Mask: top1 biased mask generation complete >> $_block/art_cmos26/drc_log
1164        flush -f $_block/mask_cmos26
1165    ) ;
```

```
1251        #Let us clean up and store the doughnut cap info.
1252        get $_rep
1253        cap_end >> $_block/cap_cmos26/cap_log 2>&1
1254        #Let us flush the art rep
1255        flush -f $_block/art_cmos26
1256    )
1257    #
1258    (file) cap_cmos26/block_hier
1259    :       (file) art_cmos26/block_hier
1260    (
1261        unlink -f $_block/cap_cmos26/cap_log
1262        STATUS "cap block hier $_blockname"
1263        echo INFO: Cbmake target $_repname/$_target >> $_block/cap_cmos26/cap_log
1264        cat $_block/art_cmos26/block_hier > $_block/cap_cmos26/block_hier
1265    ) ;
1266    #
1267    (file) cap_cmos26/trantor.db
1268    (file) cap_cmos26/$(SPICE_FILE_TARGETS)
1269    a (
1270        #This will cause a re-extract to take place when run with -s option
1271        #after a run without the -s option. Ugly?... Yes. But current cbmake
1272        #restrictions force us to do this.
1273        if ("$TRAN_SPICEP" == "TRUE")
1274        then
1275            if ( `empty_file $_block/cap_cmos26/cap.sckt` )
1276            then
1277                unlink -f $_block/cap_cmos26/cap.sckt
1278            fi
1279        fi
1280    )
1281    :
1282            (file) cap_cmos26/block_hier
1283            `cat $_block/cap_cmos26/block_hier`/cap_cmos26/cap_passed %hierarchical
1284            art_cmos26/passed
1285            (variable) cap_cmos26/$(CAP_REV_TARGETS)
1286            (file) cap_cmos26/$(SPICE_TMPL_FILE) %optional
1287        %next_option
1288    |
1289            (file) cap_cmos26/block_hier
1290            `cat $_block/cap_cmos26/block_hier`/cap_cmos26/cap_passed %hierarchical
1291            art_cmos26/passed
1292            (variable) cap_cmos26/$(CAP_REV_TARGETS)
1293            (file) cap_cmos26/$(SPICE_TMPL_FILE) %optional
1294            (file) art_cmos26/trantor.db
1295            art_cmos26/no_hard_errors
1296        %invoke run_cap_extract
1297    |
1298            (file) cap_cmos26/block_hier
1299            `cat $_block/cap_cmos26/block_hier`/cap_cmos26/trantor.db %hierarchical
1300            `cat $_block/cap_cmos26/block_hier`/cap_cmos26/$(SPICE_FILE_TARGETS) %hierarchical
1301            (variable) cap_cmos26/$(CAP_REV_TARGETS)
1302            (file) cap_cmos26/$(SPICE_TMPL_FILE) %optional
1303            (file) art_cmos26/trantor.db
1304            (assert) 'no_stopping'
1305        %invoke run_cap_extract
1306    ;
1307    #
1308    cap_cmos26/cap_passed
1309    :       (file) cap_cmos26/block_hier
1310            `cat $_block/cap_cmos26/block_hier`/cap_cmos26/cap_passed %hierarchical
1311            (file) cap_cmos26/trantor.db
1312            (file) cap_cmos26/$(SPICE_FILE_TARGETS)
1313            art_cmos26/passed                      # check trantor.db before passed
1314    (
1315        STATUS "cap-extract passed for $_blockname"
1316        echo INFO: Cbmake target $_repname/$_target >> $_block/cap_cmos26/cap_log
1317        echo Capacitance: cap extract passed >> $_block/cap_cmos26/cap_log
1318        echo End cap-extract of $_blockname at 'date' >> $_block/cap_cmos26/cap_log
1319        sh $CBROOT/lib/util/rm_dup_mess $_block/cap_cmos26/cap_log
1320        cbm_summarize $_block/art_cmos26/drc_log $_block/cap_cmos26/cap_log
1321    ) ;
1322    #
1323    ##########################################################################
1324    # Osmosis
1325    ##########################################################################
1326    #
1327    #
1328    # SCIP Schematics
1329    #
1330    # get script fragment for schematic stuff
1331    %include scipeval.cbm
1332    #
1333    sch_cmos26/osmosis_sources
1334    :       sch_cmos26/incl_dbs
1335    (
```

```
1166  #
1167  (file) tm1_cmos26/mebes.out : (file) tm1_cmos26/trantor.db
1168  (
1169      STATUS "Start 1-piece mebes generation for $_blockname"
1170      echo INFO: Cbmake target $_repname/$_target >> $_block/art_cmos26/drc_log
1171      echo INFO: begin mebes generation for $_block >> $_block/art_cmos26/drc_log
1172      unlink -f $_rep/mebes.log
1173  #
1174      sh mkmebes -f $_rep/mebes.out \ -s 5 -h 1024 $MEBES_GRID \
1175                 $MEBES_MAP_FILE \
1176                 $_rep \
1177                 > $_rep/mebes.log
1178      echo Mebes generation complete >> $_block/art_cmos26/drc_log
1179      sh $CBROOT/lib/util/rm_dup_mess $_block/art_cmos26/drc_log
1180  ) ;
1181  #
1182  ##########################################################################
1183  # make top mask data for a multi-tape chip release
1184  ##########################################################################
1185  #
1186  (file) tm2_cmos26/trantor.db :
1187          (variable) cbmake_bias_script_revision
1188          (file) art_cmos26/block_hier
1189          'cat $_block/art_cmos26/block_hier'/bias_cmos26/passed %hierarchical
1190          (file) 'cat $_block/art_cmos26/block_hier'/mask_cmos26/trantor.db %hierarchical
1191          mask_cmos26/passed
1192          (file) mask_cmos26/trantor.db
1193  (
1194  # make special bias rep for top block
1195      STATUS "Start final biased mask generation for $_blockname on multiple tapes"
1196      echo INFO: Cbmake target $_repname/$_target >> $_block/art_cmos26/drc_log
1197      echo INFO: begin final biased mask generation for $_block >> $_block/art_cmos26/drc_log
1198      get -r $_block/mask_cmos26
1199      check_top_level
1200      art_mkbias -2 >> $_block/art_cmos26/drc_log
1201      echo Mask: top2 biased mask generation complete >> $_block/art_cmos26/drc_log
1202      flush -f $_block/mask_cmos26
1203  ) ;
1204  #
1205  (file) tm2_cmos26/mebes.out : (file) tm2_cmos26/trantor.db
1206  (
1207      STATUS "Start multi-piece mebes generation for $_blockname"
1208      echo INFO: Cbmake target $_repname/$_target >> $_block/art_cmos26/drc_log
1209      echo INFO: begin mebes generation for $_block >> $_block/art_cmos26/drc_log
1210      unlink -f $_rep/mebes.log
1211  #
1212      sh mkmebes -f $_rep/mebes.out \
1213                 -s 5 -h 1024 $MEBES_GRID \
1214                 $MEBES_MAP_FILE \
1215                 $_rep \
1216                 > $_rep/mebes.log
1217      echo Mebes generation complete >> $_block/art_cmos26/drc_log
1218      sh $CBROOT/lib/util/rm_dup_mess $_block/art_cmos26/drc_log
1219  ) ;
1220  #
1221  ##########################################################################
1222  # Capacitance extract- all three cases - max, min and nom
1223  ##########################################################################
1224  #
1225  %action run_cap_extract
1226  (
1227      echo INFO: Start cap_extract of $_blockname
1228      STATUS "cap extract $_blockname"
1229      echo INFO: Cbmake target $_repname/$_target >> $_block/cap_cmos26/cap_log
1230      unlink -f $_block/cap_cmos26/hier_cap.max
1231      unlink -f $_block/cap_cmos26/hier_cap.min
1232      unlink -f $_block/cap_cmos26/hier_cap.nom
1233      echo Start cap-extract of $_blockname at 'date' on $hostname >> $_block/cap_cmos26/cap_log
1234      get -r $_block/art_cmos26
1235      cap_extract >> $_block/cap_cmos26/cap_log 2>&1
1236      if ("$TRAN_SPICEP" == "TRUE")
1237      then
1238         unlink -f $_block/cap_cmos26/cap.sckt
1239         #Let us now create the spice sub-circuit
1240         run_spicepath $_rep
1241      else
1242         unlink -f $_block/cap_cmos26/cap.sckt
1243         sh touch $_block/cap_cmos26/cap.sckt
1244      fi
1245      children='lshier */cap_cmos26'
1246      if ("$children" != "")
1247      then
1248         STATUS "flush children $children"
1249         flush -f $children
1250      fi
```

```
1336        STATUS "osmosis_sources $_blockname/$_repname"
1337        echo INFO: Cbmake target $_repname/$_target >> $_block/art_cmos26/drc_log
1338   ) ;
1339   sch_cmos26/osmosis_input
1340   :      (file) sch_cmos26/scip_bdl
1341   (
1342        STATUS "osmosis_input $_blockname/$_repname"
1343        echo INFO: Cbmake target $_repname/$_target >> $_block/art_cmos26/drc_log
1344   ) ;
1345   ##########################################################################
1346   #
1347   # Trantor Schematics
1348   #
1349   # get script fragment
1350   # %include tr_eval.cbm
1351   #
1352   sch/osmosis_sources
1353   :       sch/sources
1354   (
1355        STATUS "osmosis_sources $_blockname/$_repname"
1356        echo INFO: Cbmake target $_repname/$_target >> $_block/art_cmos26/drc_log
1357   ) ;
1358   sch/osmosis_input
1359   :      sch/passed
1360          sch/connect_dbs
1361   (
1362        STATUS "osmosis_input $_blockname/$_repname"
1363        echo INFO: Cbmake target $_repname/$_target >> $_block/art_cmos26/drc_log
1364   ) ;
1365   #
1366   ##########################################################################
1367   # This is the electromigration target.
1368   ##########################################################################
1369   %include electro.cbm
   1   #
   2   #                    electro.cbm
   3   #
   4   ##########################################################################
   5   # This is the electromigration target.
   6   # All of the dependencies and actions needed to perform an
   7   # electromigration check are included in this cbmake script.
   8   ##########################################################################
   9
  10   electro_cmos26/electro_ready : <block>/cap_cmos26/cap_passed
  11          `cat $_block/art_cmos26/block_hier`/electro_cmos26/electro_passed
  12          (file) <block>/electro_cmos26/migrate.in
  13
  14   (
  15          echo INFO: Start electromigration check of $_blockname
  16          unlink -f $_block/electro_cmos26/electro_log
  17          echo INFO: Cbmake target $_repname/$_target >> $_block/electro_cmos26/electro_log
  18   );
  19   #
  20   (file) electro_cmos26/trantor.db : <block>/electro_cmos26/electro_ready
  21   (
  22          STATUS("electromigration check of $_blockname")
  23          unlink -f $_block/electro_cmos26/electro_log
  24          echo INFO: Cbmake target $_repname/$_target >> $_block/electro_cmos26/electro_log
  25          echo Start electromigration check of $_blockname at `date` on $hostname >> $_block/electro_cmos26/electro_log
  26          migrate.batch $_block >> $_block/electro_cmos26/electro_log
  27          flush -f */art_cmos26 */cap_cmos26 */electro_cmos26
  28   );
  29   #
  30   (file) electro_cmos26/migrate.in
  31
  32   @ ( same_as_last_frequency )
  33
  34   :      (file) electro_cmos26/sch_props %optional
  35          (file) electro_cmos26/defaults
  36          (file) cap_cmos26/capsum.max
  37   (
  38          BLOCKPATH=$SAVEBLOCKPATH
  39          export BLOCKPATH
  40          sh "buildElectroScript $_block > $_block/electro_cmos26/migrate.in"
  41   #      unlink $_block/electro_cmos26/migrate.in1 $_block/electro_cmos26/migrate.in2
  42          BLOCKPATH=""
  43          export BLOCKPATH
  44          echo $frequency > $_block/electro_cmos26/last_frequency
  45   )
  46   |      (file) electro_cmos26/defaults
  47          (file) cap_cmos26/capsum.max
  48   (
  49          BLOCKPATH=$SAVEBLOCKPATH
  50          export BLOCKPATH
  51          sh "buildElectroScript $_block > $_block/electro_cmos26/migrate.in"
```

```
52  #       unlink $_block/electro_cmos26/migrate.in1 $_block/electro_cmos26/migrate.in2
53          BLOCKPATH=""
54          export BLOCKPATH
55          echo $frequency > $_block/electro_cmos26/last_frequency
56  );
57
58  #
59  (file) cap_cmos26/capsum.max :
60          (file) cap_cmos26/hier_cap.max
61  (
62          BLOCKPATH=$SAVEBLOCKPATH
63          export BLOCKPATH
64          sh "capsum -c max $_blockname"
65          BLOCKPATH=""
66          export BLOCKPATH
67  );
68
69  #
70  (file) electro_cmos26/sch_props :
71          (file) sch_cmos26/trantor.db
72  (
73          get $_block/sch_cmos26
74          getSchProps > $_block/electro_cmos26/sch_props
75  );
76  #
77  (file) electro_cmos26/defaults :
78  (
79          sh "electroDefault $_block/electro_cmos26/defaults"
80  );
81  #
82  electro_cmos26/electro_passed : (file) electro_cmos26/trantor.db
83  (
84    echo Electromigration: $ELECTRO_ERRORS errors >> $_block/electro_cmos26/electro_log
85    echo Electromigration: $ELECTRO_ERRORS errors >> $_block/art_cmos26/drc_log
86    echo Electromigration: $ELECTRO_ERRORS errors
87    echo End electromigration check of $_blockname at 'date' >> $_block/electro_cmos26/electro_log
88    cbm_summarize $_block/art_cmos26/piece_vlog $_block/art_cmos26/block_vlog $_block/art_cmos26/block_wlog \
89    $_block/electro_cmos26/electro_log
90    echo "electromigration is valid"
91  );
92
93  electro_cmos26/post : <block>/art_cmos26/post
94          (file) <block>/art_cmos26/block_hier
95          'cat $_block/cap_cmos26/block_hier'/electro_cmos26/post
96          <block>/electro_cmos26/electro_passed
97  (
98      STATUS("electro post $_blockname")
99      echo INFO: Cbmake target $_repname/$_target >> $_block/art_cmos26/block_vlog
100     cbm_summarize $_block/art_cmos26/piece_vlog $_block/art_cmos26/block_vlog $_block/art_cmos26/block_wlog \
101         $_block/electro_cmos26/electro_log
102 )
103 |      <block>/art_cmos26/post
104        (file) <block>/cap_cmos26/block_hier
105        'cat $_block/cap_cmos26/block_hier'/electro_cmos26/post
106 (
107     STATUS("electro post $_blockname")
108     echo INFO: Cbmake target $_repname/$_target >> $_block/art_cmos26/block_vlog
109     cbm_summarize $_block/art_cmos26/piece_vlog $_block/art_cmos26/block_vlog $_block/art_cmos26/block_wlog \
110         $_block/electro_cmos26/electro_log
111 );
112 #
113 #(file) electro_cmos26/piglet.db : (file) <block>/electro_cmos26/trantor.db
114 #(
115 #   STATUS("convert electromigration errors to piglet.db for $_blockname")
116 #   unlink -f $_block/electro_cmos26/piglet.db
117 #   sh touch $_block/electro_cmos26/piglet.db
118 #   sh /users/phil/lib/electroToPiglet $(_block) >> $_block/electro_cmos26/electro_log 2>&1
119 #) ;
1   #!/bin/ksh
2   #
3   #                       buildElectroScript
4   #
5   # build up the script which trantor will run for electromigration
6   #       if the file $BLOCK/electro_$ICPROCESS/defaults exists, it will be
7   #       used. Otherwise a static current of 0, 1 branch per signal
8   #       will be used. In all cases, make_electro requires a -F option
9   #       to specify the default frequency. This can be overridden on a
10  #       per signal basis in the defaults file
11  #       format of BLOCK/electro_$ICPROCESS/defaults:
12  #
13  #       sig     SIGNAL
14  #       freq    frequency
15  #       stat    static_current
16  #       branch  number_of_branches
17  #       volts   voltage_swing
18  #
```

```
19   if [ $# != 1 ]
20   then
21           echo usage: $0 BLOCK
22   fi
23   cd $1
24   grep -v "^_[SN]" cap_$ICPROCESS/capsum.max | grep -v "\.[a-zA-Z_]" |
25   fgrep -v "/"    | fgrep -v 'femtofarads
26   Internet
27   ------' > electro_$ICPROCESS/migrate.in1
28   if [ -r electro_$ICPROCESS/defaults ]
29   then
30           cat $1/electro_$ICPROCESS/defaults $1/electro_$ICPROCESS/sch_props $1/electro_$ICPROCESS/migrate.in1 > $1/electro_$ICPROCESS/migrate.in2
31           awk '
32   /#/     {next};
33   /sig/   {signal=$2;next;}
34   /freq/  {freq[signal]=$2;next;}
35   /stat/  {stat[signal]=$2;next;}
36   /branch/    {bran[signal]=$2;next}
37   /cap/   {cap[signal]=$2;next}
38   /volts/ {volts[signal]=$2;next}
39   /uni/   {uni[signal]=1;next}
40   /^$/    {next;}
41
42   {
43           if (freq[$1] != 0)
44                   freq_string="-f "freq[$1]" "
45           else
46                           VSWING=$2;
47                           shift;shift;
48                           ;;
49           esac
50   done
51   if ($FREQUENCY == 0)
52   then
53           echo usage: $usage
54           exit 1
55   fi
56
57   ###############
58   ### contact function
59   ### $1 = contact layer  (one single contact)
60   ### $2 = metal layer
61   ###############
62
63
64   # calculate width of different types of metal based on max current density
65           # current (in milliamps)
66           I=(($BI_MULT * $2 * $VSWING * $FREQUENCY + $static)/$branches*1000)
67
68           # widths
69   if ($BI_MULT == 2)  # bidirectional
70   then
71           W1=($I/3 + 0.3)
72           W2=($I/3 + 0.3)
73           W3=($I/5.5 + 0.6)
74   else
75           W1=($I/1 + 0.3)
76           W2=($I/1 + 0.3)
77           W3=($I/2 + 0.6)
78   fi
79
80   echo $1 C=$2 I=$I w1=$W1 w2=$W2 w3=$W3
81   echo "          branches=$branches static=$static f=$FREQUENCY v=$VSWING $uni"
82
83           # metal1 - contact1
84           sbn -l METAL1 $1 ^l smetal1
85           sbn -l METAL2 $1 ^l smetal2
86           sbn -l METAL3 $1 ^l smetal3
87           sbn -l CONT1_POLY -l CONT1_ACTIVE $1 ^l scont1
88           sbn -l CONT2 $1 ^l scont2
89           sbn -l CONT3 $1 ^l scont3
90           width smetal1 $W1 ^l tmp.metal1
91           andnot tmp.metal1 smetal1 ^l tmp.metal1
92           andnot tmp.metal1 scont1 ^l tmp.metal1
93           andnot tmp.metal1 scont2 ^l metal1Violations
94           # metal2 - contact2
95           width smetal2 $W2 ^l tmp.metal2
96           andnot tmp.metal2 smetal2 ^l tmp.metal2
97           andnot tmp.metal2 scont2 ^l tmp.metal2
98           andnot tmp.metal2 scont3 ^l metal2Violations
99           # metal2 - contact2
100          width smetal3 $W3 ^l tmp.metal3
101          andnot tmp.metal3 smetal3 ^l tmp.metal3
102          andnot tmp.metal3 scont3 ^l metal3Violations
103          ###
```

```
104   #  now look for sufficient metal around contacts and vias
105   #  use the John Morgan inspired algorithm
106   #
107   # grow all contacts by $W - 0.4
108   # and with metal1
109   # check for W + 0.8 width
110   # subtract off metal to leave only area where metal should be added
111   # contact1
112           size scont1 ($W1 - 0.4) ^l tmp.metal1
113           and smetal1 tmp.metal1 ^l tmp.metal1
114           width tmp.metal1 ($W1 + 0.8) ^l tmp.metal1
115           andnot tmp.metal1 smetal1 ^l cmetal1Violations
116   # contact2
117           size scont2 ($W2 - 0.4) ^l tmp.metal2
118           and smetal2 tmp.metal2 ^l tmp.metal2
119           width tmp.metal2 ($W2 + 0.8) ^l tmp.metal2
120           andnot tmp.metal2 smetal2 ^l cmetal2Violations
121   # contact3
122           size scont3 ($W3 - 0.8) ^l tmp.metal3
123           and smetal3 tmp.metal3 ^l tmp.metal3
124           width tmp.metal3 ($W3 + 0.8) ^l tmp.metal3
125           andnot tmp.metal3 smetal3 ^l cmetal3Violations
126
127   # only take violations which are not in children
128           andnot metal1Violations INSTANCE.BOUNDS ^l metal1Violations
129           andnot metal2Violations INSTANCE.BOUNDS ^l metal2Violations
130           andnot metal3Violations INSTANCE.BOUNDS ^l metal3Violations
131   #       inside metal2Violations INSTANCE.BOUNDS ^l m2InChild
132   #       inside metal3Violations INSTANCE.BOUNDS ^l m3InChild
133   #       andnot metal1Violations m1InChild ^l metal1Violations
134   #       andnot metal2Violations m2InChild ^l metal2Violations
135   #       andnot metal3Violations m3InChild ^l metal3Violations
136
137           andnot cmetal1Violations INSTANCE.BOUNDS ^l cmetal1Violations
138           andnot cmetal2Violations INSTANCE.BOUNDS ^l cmetal2Violations
139           andnot cmetal3Violations INSTANCE.BOUNDS ^l cmetal3Violations
140   #       inside cmetal2Violations INSTANCE.BOUNDS ^l m2InChild
141   #       inside cmetal3Violations INSTANCE.BOUNDS ^l m3InChild
142   #       andnot cmetal1Violations m1InChild ^l cmetal1Violations
143   #       andnot cmetal2Violations m2InChild ^l cmetal2Violations
144   #       andnot cmetal3Violations m2InChild ^l cmetal3Violations
145   #
146   # look for current in excess of what can be carried in 1 contact.  If
147   # found, highlight every contact of that type on the net
148   #
149   # cont1, cont2 and cont3: Unidirectional 1ma, Bidirectional 3ma
150   if ( $uni == "BIDIR") # bidirectional
151   then
152           if ($I > 3.0)
153           then
154                   or scont1 ^^l cmetal1Violations
155                   or scont2 ^^l cmetal2Violations
156                   or scont3 ^^l cmetal3Violations
157           fi
158   else
159           if ($I > 1.0)
160           then
161                   or scont1 ^^l cmetal1Violations
162                   or scont2 ^^l cmetal2Violations
163                   or scont3 ^^l cmetal3Violations
164           fi
165   fi
166
167   # check for errors for this signal
168           lsshape metal1Violations > /dev/null
169           if ($? != 0)
170           then
171                   echo "  metal1: $?";
172           fi
173           lsshape metal2Violations > /dev/null
174           if ($? != 0)
175           then
176                   echo "  metal2: $?";
177           fi
178           lsshape metal3Violations > /dev/null
179           if ($? != 0)
180           then
181                   echo "  metal3: $?";
182           fi
183           lsshape cmetal1Violations > /dev/null
184           if ($? != 0)
185           then
186                   echo "  metal1 contact: $?";
187           fi
188           lsshape cmetal2Violations > /dev/null
189           if ($? != 0)
```

```
190        then
191                echo "  metal2 contact: $?";
192        fi
193
194        lsshape cmetal3Violations > /dev/null
195        if ($? != 0)
196        then
197                echo "  metal3 contact: $?";
198        fi
199
200 # add to previous violations for this block
201
202        or metal1Violations ^^l m1Violations
203        or metal2Violations ^^l m2Violations
204        or metal3Violations ^^l m3Violations
205        or cmetal1Violations ^^l cm1Violations
206        or cmetal2Violations ^^l cm2Violations
207        or cmetal3Violations ^^l cm3Violations
208
  1 #
  2 #                       doWidth
  3 #
  4 # trantor script to look at (metal1 - contact1) and (metal2 - contact2)
  5 #       for electromigration width violations
  6 #       usage:
  7 #               $0 signal capacitance
  8 #
  9 usage="$0 [-s static_current ] [-b branches) [-u] [-v volt_swing] \
 10         -f FREQUENCY signal capacitance"
 11 # parse options
 12 getopt "s:b:f:" > /dev/null
 13 if ($? != 0)
 14 then
 15        echo usage: $usage
 16        exit 1
 17 fi
 18 # default values
 19 static=0
 20 branches=1
 21 FREQUENCY=0
 22 VSWING=5.5
 23 uni="BIDIR"
 24 BI_MULT=2  # multiplier for bidirectional current
 25 for user_option in $*
 26 do
 27        case $(user_option) in
 28                -s)     # static current
 29                        static=$2
 30                        shift;shift
 31                        ;;
 32                -b)     # branches
 33                        branches=$2;
 34                        shift;shift;
 35                        ;;
 36                -f)     # FREQUENCY
 37                        FREQUENCY=$2;
 38                        shift;shift;
 39                        ;;
 40                -u)     # unidirectional current
 41                        BI_MULT=1;
 42                        uni="UNIDIR"
 43                        shift;
 44                        ;;
 45                -v)     # voltage swing
 46        freq_string="-f "frequency"."
 47    if (stat[$1] != 0)
 48            stat_string="-s "stat[$1]" "
 49    else stat_string=""
 50    if (bran[$1] != 0)
 51            bran_string="-b "bran[$1]" "
 52    else bran_string=""
 53    if (volts[$1] != 0)
 54            volts_string="-v "volts[$1]" "
 55    else volts_string=""
 56    if (volts[$1] != 0)
 57            volts_string="-v "volts[$1]" "
 58    else volts_string=""
 59    if (uni[$1] != 0)
 60            uni_string="-u "
 61    else uni_string=""
 62        cap_string=cap[$1]+$6*1e-15
 63 print "doWidth " stat_string bran_string uni_string freq_string $1" "cap_string
 64 )' frequency=$frequency $1/electro_$ICPROCESS/migrate.in2 |
 65    fgrep -v 'VDD
 66    VBG
```

```
67    GND'
68    else
69            awk '(print "doWidth -f "frequency" "$1" "$6"e-15)' frequency=$frequency $1/electro_$ICPROCESS/migrate.in1 |
70    fgrep -v 'VDD
71    VBG
72    GND'
73    fi
1     #
2     #                       getSchProps
3     #
4     # look for schematic properties that start with 'E_' for all signals, and print
5     # them out
6     for i in 'lssig'
7     do
8             lsprop -S $i > /dev/null
9             if ($? != 0); then
10                    lsprop -HS $i | \
11                            awk '/[^A-Z]E_/ (print "sig "$1;print $2" "$3)' | \
12                            sed 's/E_//g'
13            fi
14    done
1     #
2     #                       migrate.batch
3     #
4     # this trantor script will set up the proper variables, run the
5     # migrate.in script, and output the results of the electromigration check.
6     nm1Violations=0
7     nm2Violations=0
8     nm3Violations=0
9     flush -f $1/art_$ICPROCESS
10    get -r $1/art_$ICPROCESS
11    topblockrep=$CURBLOCK/$CURREP
12    topblock=$CURBLOCK
13    indent="-"
14    get $topblockrep > /dev/null
15    # only take violations which are not in children
16            promote -i -r */encap_$ICPROCESS BLOCK.BOUND ^l INSTANCE.BOUNDS
17            or INSTANCE.BOUNDS ^l INSTANCE.BOUNDS
18    # execute the migrate.in script that was built with buildElectroSc
19    $CURBLOCK/electro_$ICPROCESS/migrate.in
20    # summarize results
21    get -r $topblockrep > /dev/null
22    lsshape m1Violations > /dev/null
23    nm1Violations=($nm1Violations + $?)
24    lsshape cm1Violations > /dev/null
25    nm1Violations=($nm1Violations + $?)
26    lsshape m2Violations > /dev/null
27    nm2Violations=($nm2Violations + $?)
28    lsshape cm2Violations > /dev/null
29    nm2Violations=($nm2Violations + $?)
30    lsshape m3Violations > /dev/null
31    nm3Violations=($nm3Violations + $?)
32    lsshape cm3Violations > /dev/null
33    nm3Violations=($nm3Violations + $?)
34    echo metal 1 violations: $nm1Violations
35    echo metal 2 violations: $nm2Violations
36    echo metal 3 violations: $nm3Violations
37    ELECTRO_ERRORS="$nm1Violations metal1, $nm2Violations metal2, $nm3Violations metal3"
38    makerep electro_$ICPROCESS -l cm1Violations cm2Violations cm3Violations m1Violations m2Violations m3Violations block.bound -t -i > /dev/null 2>&1
39    flush -f */encap_$ICPROCESS
1     #!/bin/ksh
2     #
3     #                       electroDefault
4     #
5     # create a template for the defaults file
6     if [ ! -s $1 ]
7     then
8     echo "# specify new default electromigration values here" > $1
9     echo "sig signame" >> $1
10    echo "freq  25000000" >> $1
11    echo "stat 1e-6" >> $1
12    echo "branch 1" >> $1
13    echo "volts 5.5" >> $1
14    fi
15
```

What is claimed is:

1. A computer-implemented method for use in making an integrated circuit, comprising the steps of:
   a) analyzing predefined artwork data associated with the circuit to determine a capacitance of a net of the circuit;
   b) determining a frequency associated with said net;
   c) determining a voltage swing associated with said net;
   d) computing a current on the basis of at least said capacitance, frequency and voltage swing;
   e) computing a minimum allowable width for said net on the basis of at least said current; and
   f) providing an indication of whether said net fails to meet said minimum width;
   wherein steps a through f are carried out by a computer.

2. The method recited in claim 1, further comprising the steps of:
   determining the number of branches of said net and a static current, if any, associated with said net; and
   computing said current as a function of at least said capacitance, frequency, voltage swing, number of branches and static current.

3. The method recited in claim 2, wherein said minimum width is determined for a three-layer device in accordance with the following table:

| Bidirectional Current | Unidirectional Current |
| --- | --- |
| w1 = (i/3.0 + 0.3) μm | w1 = (i + 0.3) μm |
| w2 = (i/3.0 + 0.3) μm | w2 = (i + 0.3) μm |
| w3 = (i/5.5 + 0.6) μm | w3 = (i/2.0 + 0.6) μm | where i represents the current and w1, w2 and w3 represent the minimum widths for respective metal layers of the device.

4. The method recited in claim 2, wherein said minimum width is determined in accordance with the rule:

$$w=(i/0.75+0.4)\mu m,$$

where w is the minimum width of a layer of the device.

5. The method recited in claim 2, further comprising the step of determining whether said current is greater than the current allowed in a single contact and, if so, providing a signal indicative of that.

6. The method recited in claim 5, further comprising the step of providing a signal indicating that the number of contacts should be increased.

7. The method recited in claim 1 or claim 5, further comprising the step of graphically indicating, on artwork representing the circuit, locations at which the width of said net should be increased.

8. A method of verifying the electromigration characteristics of a circuit, characterized by the following steps to be executed for each net to be examined:
   a) determining data about the shapes of metal which compose the net;
   b) determining data about the capacitance of the net;
   c) determining data about the average frequency of the net;
   d) determining data about the voltage swing of the net;
   e) computing, on the basis of the capacitance, average frequency and voltage swing, the absolute value of the average current needed to charge and discharge the net;
   f) computing, on the basis of said current, the minimum width of metal required for the net; and,
   g) if the net is in violation of the minimum width requirement, graphically indicating the location of the net on artwork for the circuit.

9. The method recited in claim 8, further comprising the steps of:
   determining the number of branches of the net and a static current, if any, associated with the net; and
   computing the current as a function of at least the capacitance, frequency, voltage swing, number of branches and static current.

10. The method recited in claim 9, wherein the minimum width is determined for a three-layer device in accordance with the following table:

| Bidirectional Current | Unidirectional Current |
| --- | --- |
| w1 = (i/3.0 + 0.3) μm | w1 = (i/1 + 0.3) μm |
| w2 = (i/3.0 + 0.3) μm | w2 = (i/1 + 0.3) μm |
| w3 = (i/5.5 + 0.6) μm | w3 = (i/2.0 + 0.6) μm | where i represents the current and w1, w2 and w3 represent the minimum widths for respective metal layers of the device.

11. The method recited in claim 9, wherein the minimum width is further determined in accordance with the rule:

$$w=(i/0.75+0.4)\mu m,$$

where w is the minimum width of a layer of the device.

12. The method recited in claim 9, further comprising the step of determining whether the current is greater than the current allowed in a single contact and, if so, providing a signal indicative of that.

13. An apparatus for verifying the electromigration characteristics of an integrated circuit, comprising:
   a) means for determining a capacitance of a net of the circuit;
   b) means for determining a frequency associated with said net;
   c) means for determining a voltage swing associated with said net;
   d) means for computing a current on the basis of at least said capacitance, frequency and voltage swing;
   e) means for computing a minimum allowable width for said net on the basis of at least said current; and
   f) means for providing an indication of whether said net fails to meet said minimum width requirement.

14. The apparatus recited in claim 13, further comprising:
   means for determining the number of branches of said net and a static current associated with said net; and
   means for computing said current as a function of at least said capacitance, frequency, voltage swing, number of branches and static current.

15. The apparatus recited in claim 14, comprising means for computing said minimum width for a three-layer device in accordance with the following table:

| Bidirectional Current | Unidirectional Current |
| --- | --- |
| w1 = (i/3.0 + 0.3) μm | w1 = (i/1 + 0.3) μm |
| w2 = (i/3.0 + 0.3) μm | w2 = (i/1 + 0.3) μm |
| w3 = (i/5.5 + 0.6) μm | w3 = (i/2.0 + 0.6) μm | where i represents the current and w1, w2 and w3 represent the minimum widths for respective metal layers of the device.

16. The apparatus recited in claim 14, further comprising means for computing said minimum width in accordance with the rule:

$$w = (i/0.75 + 0.4) \mu m,$$

where w is the minimum width of a layer of the device.

17. The apparatus recited in claim 14, further comprising means for determining whether said current is greater than the current allowed in a single contact and, if so, providing an indication of such.

18. The apparatus recited in claim 13 or claim 17, further comprising means for graphically indicating on artwork representing the circuit locations at which the width of said net should be increased.

19. A method for verifying the electromigration characteristics of an integrated circuit for which a capacitance data file and an artwork data file exist, comprising the following steps:

a) determining whether the capacitance data for the circuit at hand is up-to-date by examining respective date codes of the capacitance data file and the artwork data file;

b) running a capacitance extract program if the capacitance data is not up-to-date;

c) compiling frequency, capacitance and voltage data for the circuit;

d) computing average current data on the basis of said frequency, capacitance and voltage data;

e) computing minimum widths for respective layers of a node of the circuit on the basis of at least said average current data;

f) comparing said computed minimum widths to actual respective widths, as indicated by said artwork data, to determine where said actual widths must be increased; and g) graphically indicating the locations where said actual widths must be increased.

* * * * *